US007314701B2

(12) United States Patent
Yokoyama et al.

(10) Patent No.: US 7,314,701 B2
(45) Date of Patent: Jan. 1, 2008

(54) RADIATION-SENSITIVE RESIN COMPOSITION

(75) Inventors: Kenichi Yokoyama, Tokyo (JP); Fumihisa Miyajima, Tokyo (JP); Tomoki Nagai, Tokyo (JP); Eiji Yoneda, Tokyo (JP)

(73) Assignee: JSR Corporation, Tokyo (JP)

( * ) Notice: Subject to any disclaimer, the term of this patent is extended or adjusted under 35 U.S.C. 154(b) by 389 days.

(21) Appl. No.: 10/679,367

(22) Filed: Oct. 7, 2003

(65) Prior Publication Data

US 2005/0095527 A1 May 5, 2005

(30) Foreign Application Priority Data

Oct. 8, 2002 (JP) ............................. 2002-295260

(51) Int. Cl.
*G03C 1/73* (2006.01)
*G03F 7/039* (2006.01)
*G03F 7/038* (2006.01)

(52) U.S. Cl. ................... 430/270.1; 430/326; 430/325; 430/905; 430/910; 430/919; 430/921; 430/914

(58) Field of Classification Search ............. 430/270.1, 430/326, 325, 914, 905, 921, 919, 925, 910
See application file for complete search history.

(56) References Cited

U.S. PATENT DOCUMENTS

| | | | | |
|---|---|---|---|---|
| 5,089,373 | A * | 2/1992 | Uenishi et al. | 430/191 |
| 5,215,857 | A | 6/1993 | Hosaka et al. | 430/191 |
| 5,238,774 | A | 8/1993 | Hosaka et al. | 430/191 |
| 5,405,720 | A | 4/1995 | Hosaka et al. | 430/191 |
| 5,494,784 | A | 2/1996 | Hosaka et al. | 430/326 |
| 5,658,706 | A * | 8/1997 | Niki et al. | 430/270.1 |
| 5,891,603 | A * | 4/1999 | Kodama et al. | 430/270.1 |
| 5,925,492 | A | 7/1999 | Hosaka et al. | 430/196 |
| 6,020,104 | A | 2/2000 | Hosaka et al. | 430/191 |
| 6,136,500 | A * | 10/2000 | Kobayashi et al. | 430/270.1 |
| RE37,179 | E | 5/2001 | Yamachika et al. | 430/191 |
| 6,228,554 | B1 | 5/2001 | Hosaka et al. | 430/191 |
| 6,270,939 | B1 | 8/2001 | Hosaka et al. | 430/191 |
| 6,280,900 | B1 | 8/2001 | Chiba et al. | 430/270.1 |
| 6,337,171 | B1 | 1/2002 | Kobayashi et al. | 430/270.1 |
| 6,403,280 | B1 | 6/2002 | Yamahara et al. | 430/270.1 |
| 6,468,714 | B2 | 10/2002 | Kai et al. | 430/270.1 |
| 6,482,568 | B1 | 11/2002 | Douki et al. | 430/270.1 |
| 6,506,527 | B1 | 1/2003 | Kobayashi et al. | 430/14 |
| 6,517,992 | B1 | 2/2003 | Wang et al. | 430/270.1 |
| 6,531,260 | B2 | 3/2003 | Iwasawa et al. | 430/270.1 |
| 6,623,907 | B2 | 9/2003 | Numata et al. | 430/270.1 |
| 6,692,887 | B1 | 2/2004 | Suwa et al. | 430/270.1 |
| 2001/0041769 | A1* | 11/2001 | Iwasawa et al. | 524/588 |
| 2002/0009667 | A1 | 1/2002 | Nishimura et al. | 430/270.1 |
| 2002/0009668 | A1 | 1/2002 | Nishimura et al. | 430/270.1 |
| 2002/0058201 | A1 | 5/2002 | Miyaji et al. | 430/270.1 |
| 2002/0090569 | A1 | 7/2002 | Suzuki et al. | 430/270.1 |
| 2002/0132181 | A1 | 9/2002 | Nishimura et al. | 430/270.1 |
| 2002/0172885 | A1 | 11/2002 | Nagai et al. | 430/170 |
| 2002/0192593 | A1 | 12/2002 | Nagai et al. | 430/270.1 |
| 2003/0022095 | A1 | 1/2003 | Kai et al. | 430/170 |
| 2003/0039916 | A1* | 2/2003 | Adegawa et al. | 430/270.1 |
| 2003/0054287 | A1* | 3/2003 | Yasunami et al. | 430/270.1 |
| 2003/0113658 | A1 | 6/2003 | Ebata et al. | 430/270.1 |
| 2003/0113660 | A1 | 6/2003 | Yoneda et al. | 430/270.1 |
| 2003/0148211 | A1* | 8/2003 | Kamabuchi et al. | 430/270.1 |
| 2003/0157423 | A1 | 8/2003 | Nagai et al. | 430/170 |
| 2003/0170561 | A1 | 9/2003 | Iwasawa et al. | 430/270.1 |
| 2003/0191268 | A1 | 10/2003 | Iwasawa et al. | 528/10 |
| 2003/0194634 | A1 | 10/2003 | Nagai et al. | 430/170 |
| 2003/0203307 | A1 | 10/2003 | Soyano et al. | 430/270.1 |
| 2003/0203309 | A1 | 10/2003 | Nishimura et al. | 430/270.1 |
| 2003/0219680 | A1* | 11/2003 | Nishimura et al. | 430/270.1 |
| 2004/0048192 | A1 | 3/2004 | Shima et al. | 430/270.1 |
| 2004/0072094 | A1 | 4/2004 | Shima et al. | 430/270.1 |

FOREIGN PATENT DOCUMENTS

| | | | |
|---|---|---|---|
| JP | 1-197520 | * | 8/1989 |
| JP | 05-127369 | | 5/1993 |
| JP | 06-266111 | | 10/1994 |
| JP | 07-146558 | | 6/1995 |
| JP | 9-236923 | * | 9/1997 |

OTHER PUBLICATIONS

Chem. Abstract 1997:602802—English abstract for Jp 9-236923 (Nakano et al).*
Full English translation of JP 09-236923 (Nakano et al), provided by PTO.*
Chemical Abstract 112:66778 (English abstract for JP 1-197520).*
JPO English abstract for JP 1-197520.*

* cited by examiner

*Primary Examiner*—Sin Lee
(74) *Attorney, Agent, or Firm*—Merchant & Gould, P.C.; Christopher W. Raimund

(57) ABSTRACT

A positive tone radiation-sensitive resin composition comprising (A) a 1-substituted imidazole, (B) a photoacid generator, and (C-a) a resin protected by an acid-dissociable group, insoluble or scarcely soluble in alkali, but becoming soluble in alkali when the acid-dissociable group dissociates or (C-b) an alkali-soluble resin and an alkali solubility controller, and a negative tone radiation-sensitive resin composition comprising (A), (B), (D) an alkali-soluble resin, and (E) a compound that can crosslink the alkali-soluble resin in the presence of an acid. The radiation-sensitive resin composition of the present invention is a chemically amplified resist exhibiting high resolution and high storage stability as a composition, and suitable for microfabrication sensible to active radiations, for example, ultraviolet rays such as g-lines and i-lines, deep ultraviolet rays represented by a KrF excimer laser, ArF excimer laser, $F_2$ excimer laser, and EUV excimer laser, and electron beams.

12 Claims, 2 Drawing Sheets

RADIATION-SENSITIVE RESIN COMPOSITION

BACKGROUND OF THE INVENTION

1. Field of the Invention

The present invention relates to a radiation-sensitive resin composition suitable as a chemically-amplified resist useful for microfabrication utilizing various types of radiation, for example, ultraviolet rays such as g-line or i-line, (extreme) deep ultraviolet rays such as a KrF excimer laser, ArF excimer laser, $F_2$ excimer laser, or EUV, X-rays such as synchrotron radiation, and charged particle rays such as electron beams.

2. Description of Background Art

In the field of microfabrication represented by the manufacture of integrated circuit devices, lithographic technology enabling microfabrication with a line width of 0.20 μm or less has been demanded in order to increase the degree of integration in recent years.

A conventional lithographic process utilizes near ultraviolet rays such as i-line radiation. It is known in the art that microfabrication with a line width of a sub-quarter micron order using near ultraviolet rays is very difficult.

Therefore, use of radiation with a shorter wavelength has been studied to enable microfabrication with a line width of 0.25 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), an $F_2$ excimer laser (wavelength: 157 nm), EUV (wavelength 13 nm), and electron beams have attracted attention.

As a radiation sensitive resin composition applicable to short wavelength radiations, a number of compositions utilizing a chemical amplification effect between a component having an acid-dissociable functional group and a photoacid generator which generates an acid upon irradiation (hereinafter called "exposure") has been proposed. Such a composition is hereinafter called a chemically-amplified radiation sensitive composition.

As the chemically-amplified radiation-sensitive composition, a composition comprising a polymer containing a t-butyl ester group of carboxylic acid or a t-butylcarbonate group of phenol and a photoacid generator has been proposed. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer. A problem with this type of radiation-sensitive resin composition has been diffusion of an acid produced by exposure to radiation in the unexposed area, making it difficult to obtain a resist with high resolution. To overcome this problem, use of a basic compound such as an amine has been proposed (e.g. Japanese Patent Applications Laid-open No. 127369/1993, 266111/1994, and 146558/1995).

As acid generators used in the photolithographic process that has become more and more micronized in recent years, iodonium salts, sulfonamides, oxime sulfonates, and the like have attracted special attention due to the higher transparency to various radiations than conventional triarylsulfonium salts, in addition to alkyl sulfonium salts with higher activity. Although many of these acid generators have advantages over triarylsulfonium salts in terms of high resolution and the like, these acid generators are unstable in bases in general. If a trialkylamine, unsubstituted imidazole, and the like that have conventionally been used as acid diffusion inhibitors are added, storage stability as a resist composition is impaired due to their action of nucleophilically decomposing the acid generator in the resist composition. However, conventional acid diffusion inhibitors with weak basicity cannot exhibit a sufficient acid diffusion inhibiting effect, are liable to be affected by basic substances in the environment, and exhibit only poor environmental resistance.

An object of the present invention is to provide a radiation-sensitive resin composition useful as a chemically amplified resist exhibiting high resolution and high storage stability, and sensible to active radiations, for example, ultraviolet rays such as g-lines and i-lines, deep ultraviolet rays represented by a KrF excimer laser, ArF excimer laser, $F_2$ excimer laser, and EUV excimer laser, and electron beams.

As a result of extensive studies, the present inventors have found that a later described specific compound and a composition comprising this compound can achieve this object.

SUMMARY OF THE INVENTION

Specifically, the above object can be achieved in the present invention by a positive tone radiation-sensitive resin composition comprising:

(A) a compound of the following formula (1) (hereinafter referred to as "compound (A)"), (B) a photoacid generator (hereinafter referred to as "photoacid generator (B)"), and (C) the following component (C-a) or (C-b), (C-a) a resin protected by an acid-dissociable group, insoluble or scarcely soluble in alkali, but becoming soluble in alkali when the acid-dissociable group dissociates (hereinafter referred to as "acid-dissociable group-containing resin") or (C-b) an alkali-soluble resin and an alkali solubility controller.

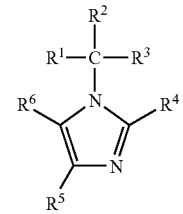

(1)

wherein $R^1$, $R^2$, $R^3$, $R^4$, $R^5$, and $R^6$ individually represent a hydrogen atom, cyano group, substituted or unsubstituted alkyl group having 1-20 carbon atoms, substituted or unsubstituted alicyclic group having 3-20 carbon atoms, substituted or unsubstituted alkenyl group having 2-20 carbon atoms, substituted or unsubstituted aryl group, or substituted or unsubstituted heteroaryl group, provided that any two groups selected from $R^1$, $R^2$, $R^3$, $R^4$, $R^5$, and $R^6$ may be bonded together to form a ring which may comprise a hetero atom or may be bonded together to form a dimer.

In the above positive tone radiation-sensitive resin composition, the photoacid generator (B) is preferably at least one compound selected from the group consisting of onium salt compounds, sulfone compounds, sulfonate compounds, sulfonimide compounds, diazomethane compounds, disulfonylmethane compounds, and oximesulfonate compounds.

More preferably, the photoacid generator (B) in the above positive tone radiation-sensitive resin composition is at least one compound selected from the group consisting of onium salt compounds and oximesulfonate compounds.

In another preferable embodiment of the above positive tone radiation-sensitive resin composition, the component (C-a), that is a resin protected by an acid-dissociable group, insoluble or scarcely soluble in alkali, but becoming soluble in alkali when the acid-dissociable group dissociates, comprises a recurring unit of the following formula (10),

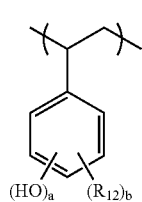

(10)

wherein $R^{12}$ represents a hydrogen atom or monovalent organic group and a and b indicates a natural number from 1 to 3.

In still another preferable embodiment of the above positive tone radiation-sensitive resin composition, the component (C-a), that is a resin protected by an acid-dissociable group, insoluble or scarcely soluble in alkali, but becoming soluble in alkali when the acid-dissociable group dissociates, comprises at least one of the recurring units of the following formulas (14) or (15):

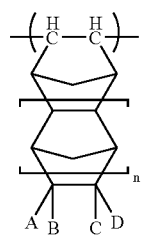

(14)

wherein A and B individually represent a hydrogen atom or an acid-dissociable group, at least one of A and B being an acid-dissociable group, D and E individually represent a hydrogen atom or a linear or branched monovalent alkyl group having 1-4 carbon atoms, and n is an integer of 0 to 2, or

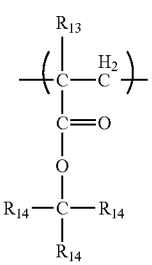

(15)

wherein $R_{13}$ represents a hydrogen atom or methyl group and $R_{14}$ individually represents a linear or branched alkyl group having 1-4 carbon atoms or a monovalent alicyclic hydrocarbon group having 4-20 carbon atoms, or any two of $R_{14}$ groups form, in combination with the carbon atom to which the two $R_{14}$ groups are bonded, a divalent alicyclic hydrocarbon group having 4-20 carbon atoms, with the remaining $R_{14}$ group being a linear or branched alkyl group having 1-4 carbon atoms or a substituted or unsubstituted monovalent alicyclic hydrocarbon group having 4-20 carbon atoms.

In still another preferable embodiment of the above positive tone radiation-sensitive resin composition, the component (C-a), that is a resin protected by an acid-dissociable group, insoluble or scarcely soluble in alkali, but becoming soluble in alkali when the acid-dissociable group dissociates, comprises at least one of the recurring units of the following formulas (16) or (17):

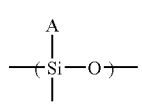

(16)

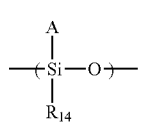

(17)

wherein A individually represents an monovalent organic group having an acid-dissociable group and $R_{14}$ represents a substituted or unsubstituted, linear, branched, or cyclic hydrocarbon group having 1-20 carbon atoms.

The above object can further be achieved in the present invention by a negative tone radiation-sensitive resin composition comprising:

(A) a compound of the above formula (1),
(B) a photoacid generator,
(D) an alkali-soluble resin, and
(E) a compound that can crosslink the alkali-soluble resin in the presence of an acid.

In the above negative tone radiation-sensitive resin composition, the photoacid generator (B) is preferably at least one compound selected from the group consisting of onium salt compounds, sulfone compounds, sulfonate compounds, sulfonimide compounds, diazomethane compounds, disulfonylmethane compounds, and oximesulfonate compounds.

More preferably, the photoacid generator (B) in the above negative tone radiation-sensitive resin composition is at least one compound selected from the group consisting of onium salt compounds and oximesulfonate compounds.

DETAILED DESCRIPTION OF THE INVENTION

Figure 1:
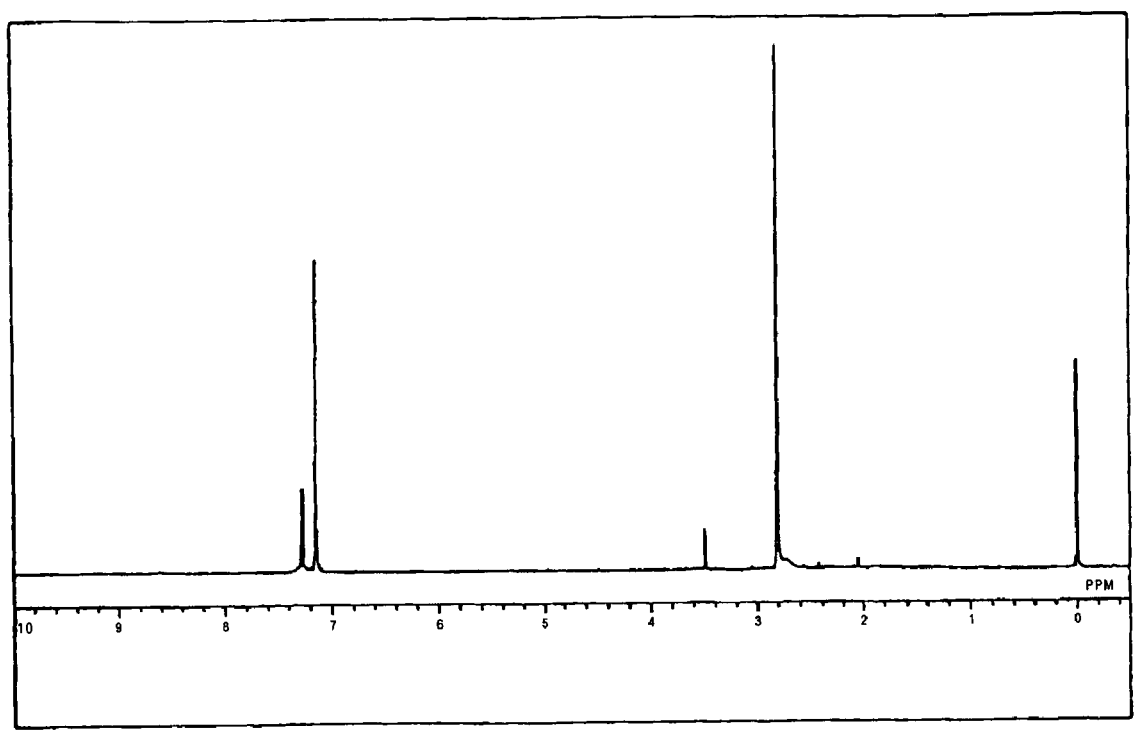
FIG. 1 is a $^1$H-NMR spectrum of the compound prepared in Synthetic Example 1.

The present invention will be described in detail below.

Compound (A)

The Compound (A) in the present invention is a nitrogen-containing compound of the above formula (1). Since the compound (A) has a basicity weaker than trialkylamines conventionally used as acid diffusion inhibitors, the compound (A) can control the decomposition due to the nucleophilic reaction of an acid generator in a resist composition. However, since the compound has a substituted alkyl group on the nitrogen atom that increases the basicity as compared with an unsubstituted compound, a sufficient acid diffusion control effect in a resist composition can be obtained.

As examples of the substituted or unsubstituted, linear, branched, or cyclic hydrocarbon group having 1-20 carbon atoms represented by $R^1$ to $R^6$ in the above formula, alkyl groups having 1-20 carbon atoms such as a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group, n-eicosyl group, i-propyl group, i-butyl group, sec-butyl group, t-butyl group, and t-dodecyl group;

a cycloalkyl group having 3-20 carbon atoms such as a cyclopentyl group, cyclobutyl group, cyclopentyl group, and cyclohexyl group;

aryl groups having 6-20 carbon atoms such as a phenyl group, tolyl group, benzyl group, methylbenzyl group, xylyl group, mesityl group, naphthyl group, and anthryl group; and bridged alicyclic hydrocarbon groups having 6-20 carbon atoms such as a norbornyl group, tetracyclodecanyl group, tetracyclododecyl group, adamantyl group, methyladamantyl group, ethyladamantyl group, and butyl adamantyl group can be given.

As examples of the alkenyl group having 1-20 carbon atoms, a vinyl group and propenyl group can be given.

The above hydrocarbon groups may be substituted. Given as the substituents are a hydroxyl group; a carboxyl group; a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; an alkoxycarbonyl group such as a methoxycarbonyl group, ethoxycarbonyl group, and t-butoxycarbonyl group; an alkoxycarbonylalkoxy group such as a methoxycarbonylmethoxy group, ethoxycarbonylmethoxy group, and t-butoxycarbonylmethoxy group; a halogen atom such as fluorine and chlorine; and a fluoroalkyl group such as a fluoromethyl group, trifluoromethyl group, and pentafluoroethyl group.

Any two groups selected from $R^1$, $R^2$, $R^3$, $R^4$, $R^5$, and $R^6$ may be bonded together to form a ring which may comprise a hetero atom. Specifically, two residual groups formed by dissociation of one atom or one group from each of the two groups selected from $R^1$, $R^2$, $R^3$, $R^4$, $R^5$, and $R^6$ either may be bonded together directly, via a hetero atom such as a sulfur atom, oxygen atom, or nitrogen atom, or via a divalent organic group such as a methylene group or ethylene group to produce a cyclic structure. As a specific cyclic structure, a structure in which the two groups selected from $R^1$, $R^2$, $R^3$, $R^4$, $R^5$, and $R^6$ are bonded together via a methylene group, ethylene group, propylene group, 1,2-dimethylethylene group, carbonyl group, or the like can be given.

The groups $R^1$-$R^6$ may be bonded together to form a dimer. Specifically, two molecules of the compound (A) may form a dimer by bonding together via at least one group selected from $R^1$, $R^2$, $R^3$, $R^4$, $R^5$, and $R^6$ in each of the two molecules. As an example of the dimer, a compound of the following formula can be given.

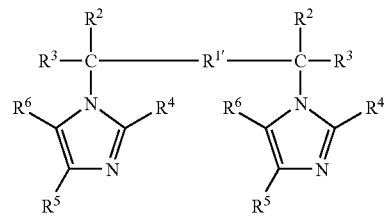

wherein $R^{1'}$ is a divalent group formed by bonding of two residues of $R^1$ groups, each produced by dissociation of one atom or one group from $R^1$ groups in two molecules.

The following compounds can be given as specific examples of compound (A):

1-methylimidazole, 1-ethylimidazole, 1-hexylimidazole, 1-nonylimidazole, 1-i-butylimidazole, 1-t-butylimidazole, 1-cyclopentylimidazole, 1-cyclohexylimidazole, 1-phenylimidazole, 1-benzylimidazole, 1-naphtylimidazole, 1-anthrylimidazole, 1-norbornylimidazole, 1-adamantylimidazole, 1-vinylimidazole, 1-(2'-hydroxyethyl)imidazole, 1-(3'-hydroxy-n-butyl)imidazole, 1-methoxyimidazole, 1-(2'-methyl-n-propoxy)imidazole, 1-cyanoimidazole, 1-(2'-cyanomethyl)imidazole, 1-methoxycarbonylimidazole, 1-ethoxycarbonylethoxyimidazole, 1-trifluoromethylimidazole, 1,2-dimethylimidazole, 1,2,4-trimethylimidazole, 1,2,4,5-tetramethylimidazole, 1-ethyl-2-methylimidazole, 1-butyl-2-methylimidazole, 1,2-dihexylimidazole, 1-ethyl-2-cyclohexylimidazole, 1,2-dicyclopentylimidazole, 1,2,4,5-tetracyclopentylimidazole, 1-benzyl-2-methylimidazole, 1,2-dinaphthylimidazole, 1,2-dinorbornylimidazole, 1,2,4-triadamantylimidazole, 1,2,4,5-tetraethoxycarbonylimidazole, 1-cyano-2-methylimidazole, 1-ethyl-2-methoxyimidazole, 1-(t-butoxycarbonylmethyl)imidazole, 1-(2',3'-dihydroxypropyl)-2-methylimidazole, and 1,3-di(2'-methyl-1'-imidazoylmethyl)benzene. Of these, particularly preferable imidazoles are 1-methylimidazole, 1,2-dimethylimidazole, 1,2,4-trimethylimidazole, 1,2,4,5-tetramethylimidazole, 1-ethylimidazole, 1-ethyl-2-methylimidazole, 1-butyl-2-methylimidazole, 1-benzylimidazole, 1-benzyl-2-methylimidazole, 1-(t-butoxycarbonylmethyl)imidazole, 1-(2',3'-dihydroxypropyl)-2-methylimidazole, and 1,3-di(2'-methyl-1'-imidazoylmethyl)benzene.

In the present invention, the compounds (A) may be used either individually or in combination of two or more, and may be used in combination of the later-described other acid diffusion inhibitors.

Acid Generator (B)

As examples of the acid generator (B), (1) onium salt compounds, (2) sulfone compounds, (3) sulfonate compounds, (4) sulfonimide compounds, (5) diazomethane compounds, and (6) disulfonylmethane compounds can be given.

Examples of these acid generators (B) are as follows:

(1) Onium Salt Compounds:

As examples of onium salts, iodonium salts, sulfonium salts (including tetrahydrothiophenium salts), phosphonium salts, diazonium salts, ammonium salts, pyridinium salts, and the like can be given.

Specific examples of the onium salt include: bis(4-t-butylphenyl)iodonium trifluoromethanesulfonate, bis(4-t-butylphenyl)iodonium nonafluoro-n-butanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium perfluoro-n-octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium 2,4-difluorobenzenesulfonate,
diphenyliodonium trifluoromethanesulfonate,
diphenyliodonium nonafluoro-n-butanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium perfluoro-n-octanesulfonate,
diphenyliodonium 2-trifluoromethylbenzenesulfonate,
diphenyliodonium 4-trifluoromethylbenzenesulfonate,
diphenyliodonium 2,4-difluorobenzenesulfonate,
triphenylsulfonium trifluoromethanesulfonate,
triphenylsulfonium nonafluoro-n-butanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonium perfluoro-n-octanesulfonate,
triphenylsulfonium 2-trifluoromethylbenzenesulfonate,
triphenylsulfonium 4-trifluorobenzenesulfonate,
triphenylsulfonium 2,4-difluorobenzenesulfonate,
triphenylsulfonium hexafluoroantimonate,
triphenylsulfonium 1-naphthalenesulfonate,
4-t-butylphenyl.diphenylsulfonium trifluoromethanesulfonate,
4-t-butylphenyl.diphenylsulfonium nonafluoro-n-butanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butylphenyl.diphenylsulfonium 4-trifluoromethylbenzenesulfonate,
4-t-butylphenyl.diphenylsulfonium 2,4-difluorobenzenesulfonate,
4-t-butoxyphenyl.diphenylsulfonium nonafluoro-n-butanesulfonate,
4-hydroxyphenyl.benzyl.methylsulfonium p-toluenesulfonate,
cyclohexyl.2-oxocyclohexyl.methylsulfonium trifluoromethanesulfonate,
dicyclohexyl.2-oxocyclohexylsulfonium trifluoromethanesulfonate, 2-oxocyclohexyldimethylsulfonium trifluoromethanesulfonate,
1-naphthyldimethylsulfonium trifluoromethanesulfonate,
1-naphthyldiethylsulfonium trifluoromethanesulfonate,
4-cyano-1-naphthyldimethylsulfonium trifluoromethanesulfonate,
4-nitro-1-naphthyldimethylsulfonium trifluoromethanesulfonate,
4-methyl-1-naphthyldimethylsulfonium trifluoromethanesulfonate,
4-cyano-1-naphthyldiethylsulfonium trifluoromethanesulfonate,
4-nitro-1-naphthyldiethylsulfonium trifluoromethanesulfonate,
4-methyl-1-naphthyldiethylsulfonium trifluoromethanesulfonate,
4-hydroxy-1-naphthyldimethylsulfonium trifluoromethanesulfonate,
4-hydroxy-1-naphthyltetrahydrothiophenium trifluoromethanesulfonate,
4-hydroxy-1-naphthyltetrahydrothiophenium nonafluoro-n-butanesulfonate,
4-hydroxy-1-naphthyltetrahydrothiophenium perfluoro-n-octanesulfonate,
4-methoxy-1-naphthyltetrahydrothiophenium trifluoromethanesulfonate,
4-methoxy-1-naphthyltetrahydrothiophenium nonafluoro-n-butanesulfonate,
4-methoxy-1-naphthyltetrahydrothiophenium perfluoro-n-octanesulfonate,
4-ethoxy-1-naphthyltetrahydrothiophenium trifluoromethanesulfonate,
4-ethoxy-1-naphthyltetrahydrothiophenium nonafluoro-n-butanesulfonate,
4-ethoxy-1-naphthyltetrahydrothiophenium perfluoro-n-octanesulfonate,
4-n-butoxy-1-naphthyltetrahydrothiophenium trifluoromethanesulfonate,
4-n-butoxy-1-naphthyltetrahydrothiophenium nonafluoro-n-butanesulfonate,
4-n-butoxy-1-naphthyltetrahydrothiophenium perfluoro-n-octanesulfonate,
4-methoxymethoxy-1-naphthyltetrahydrothiophenium trifluoromethanesulfonate,
4-methoxymethoxy-1-naphthyltetrahydrothiophenium nonafluoro-n-butanesulfonate,
4-methoxymethoxy-1-naphthyltetrahydrothiophenium perfluoro-n-octanesulfonate,
4-ethoxymethoxy-1-naphthyltetrahydrothiophenium trifluoromethanesulfonate,
4-ethoxymethoxy-1-naphthyltetrahydrothiophenium nonafluoro-n-butanesulfonate,
4-ethoxymethoxy-1-naphthyltetrahydrothiophenium perfluoro-n-octanesulfonate,
4-(1-methoxyethoxy)-1-naphthyltetrahydrothiophenium trifluoromethanesulfonate,
4-(1-methoxyethoxy)-1-naphthyltetrahydrothiophenium nonafluoro-n-butanesulfonate,
4-(1-methoxyethoxy)-1-naphthyltetrahydrothiophenium perfluoro-n-octanesulfonate,
4-(2-methoxyethoxy)-1-naphthyltetrahydrothiophenium trifluoromethanesulfonate,
4-(2-methoxyethoxy)-1-naphthyltetrahydrothiophenium nonafluoro-n-butanesulfonate,
4-(2-methoxyethoxy)-1-naphthyltetrahydrothiophenium perfluoro-n-octanesulfonate,
4-methoxycarbonyloxy-1-naphthyltetrahydrothiophenium trifluoromethanesulfonate, 4-methoxycarbonyloxy-1-naphthyltetrahydrothiophenium nonafluoro-n-butanesulfonate,
4-methoxycarbonyloxy-1-naphthyltetrahydrothiophenium perfluoro-n-octanesulfonate,
4-ethoxycarbonyloxy-1-naphthyltetrahydrothiophenium trifluoromethanesulfonate,
4-ethoxycarbonyloxy-1-naphthyltetrahydrothiophenium nonafluoro-n-butanesulfonate,
4-ethoxycarbonyloxy-1-naphthyltetrahydrothiophenium perfluoro-n-octanesulfonate,
4-n-propoxycarbonyloxy-1-naphthyltetrahydrothiophenium trifluoromethanesulfonate,
4-n-propoxycarbonyloxy-1-naphthyltetrahydrothiophenium nonafluoro-n-butanesulfonate,
4-n-propoxycarbonyloxy-1-naphthyltetrahydrothiophenium perfluoro-n-octanesulfonate,
4-i-propoxycarbonyloxy-1-naphthyltetrahydrothiophenium trifluoromethanesulfonate,
4-i-propoxycarbonyloxy-1-naphthyltetrahydrothiophenium nonafluoro-n-butanesulfonate,
4-i-propoxycarbonyloxy-1-naphthyltetrahydrothiophenium perfluoro-n-octanesulfonate,
4-n-butoxycarbonyloxy-1-naphthyltetrahydrothiophenium trifluoromethanesulfonate,
4-n-butoxycarbonyloxy-1-naphthyltetrahydrothiophenium nonafluoro-n-butanesulfonate,
4-n-butoxycarbonyloxy-1-naphthyltetrahydrothiophenium perfluoro-n-octanesulfonate,
4-t-butoxycarbonyloxy-1-naphthyltetrahydrothiophenium trifluoromethanesulfonate,
4-t-butoxycarbonyloxy-1-naphthyltetrahydrothiophenium nonafluoro-n-butanesulfonate,
4-t-butoxycarbonyloxy-1-naphthyltetrahydrothiophenium perfluoro-n-octanesulfonate,
4-(2-tetrahydrofuranyloxy)-1-naphthyltetrahydrothiophenium trifluoromethanesulfonate,
4-(2-tetrahydrofuranyloxy)-1-naphthyltetrahydrothiophenium nonafluoro-n-butanesulfonate,
4-(2-tetrahydrofuranyloxy)-1-naphthyltetrahydrothiophenium perfluoro-n-octanesulfonate,
4-(2-tetrahydropyranyloxy)-1-naphthyltetrahydrothiophenium trifluoromethanesulfonate,
4-(2-tetrahydropyranyloxy)-1-naphthyltetrahydrothiophenium nonafluoro-n-butanesulfonate,
4-(2-tetrahydropyranyloxy)-1-naphthyltetrahydrothiophenium perfluoro-n-octanesulfonate,
4-benzyloxy-1-naphthyltetrahydrothiophenium trifluoromethanesulfonate,
4-benzyloxy-1-naphthyltetrahydrothiophenium nonafluoro-n-butanesulfonate,
4-benzyloxy-1-naphthyltetrahydrothiophenium perfluoro-n-octanesulfonate,
1-(1-naphthylacetomethyl)tetrahydrothiophenium trifluoromethanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate, and
1-(3,5-dimethyl-4-hydroxyphenyl)tetrahydrothiophenium perfluoro-n-octanesulfonate.

(2) Sulfone Compounds:

As examples of the sulfone compounds, β-ketosulfone, β-sulfonylsulfone, and α-diazo compounds of these compounds can be given.

As specific examples of the sulfone compounds, phenacylphenylsulfone, mesitylphenacylsulfone, bis(phenylsulfonyl)methane, and 4-trisphenacylsulfone can be given.

(3) Sulfonate Compounds:

As examples of the sulfonate compounds, alkyl sulfonate, haloalkyl sulfonate, aryl sulfonate, and imino sulfonate can be given.

As specific examples of the sulfonate compounds, benzointosylate, pyrogallol tris(trifluoromethanesulfonate), pyrogallol tris(nonafluoro-n-butanesufonate), pyrogallol tris(methanesulfonate), nitrobenzyl-9,10-diethoxyanthracene-2-sulfonate, α-methylolbenzointosylate, α-methylolbenzoin n-octanesulfonate, α-methylolbenzoin trifluoromethanesulfonate, and α-methylolbenzoin n-dodecanesulfonate can be given.

(4) Sulfonimide Compounds:

As examples of sulfonimide compounds, compounds of the following formula (7) can be given:

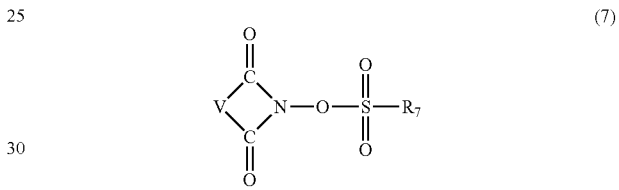

(7)

wherein V represents a divalent group such as an alkylene group, arylene group, or alkoxylene group and $R_7$ represents a monovalent group such as an alkyl group, aryl group, haloalkyl group, or haloaryl group.

Specific examples of the sulfonimide compounds include:
N-(trifluoromethanesulfonyloxy)succinimide,
N-(trifluoromethanesulfonyloxy)phthalimide,
N-(trifluoromethanesulfonyloxy)diphenylmaleimide,
N-(trifluoromethanesulfonyloxy)bicyclo[2.2.1]hept-5-ene-2,3-dicarboxyimide,
N-(trifluoromethanesulfonyloxy)-7-oxabicyclo[2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide, N-(p-toluenesulfonyloxy)bicyclo[2.2.1]heptan-5,6-oxy-2,3-dicarboxyimide, N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide,
N-(2-trifluoromethylbenzenesulfonyloxy)bicyclo[2.2.1]heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo[2.2.1]hept-5-ene-2,3-dicarboxyimide,
N-(4-trifluoromethylbenzenesulfonyloxy)bicyclo[2.2.1]heptan-5,6-oxy-2,3-dicarboxyimide,
N-(4-trifluoromethylbenzenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro-n-butanesulfonyloxy)bicyclo[2.2.1]heptan-5,6-oxy-2,3-dicarboxyimide,
N-(nonafluoro-n-butanesulfonyloxy)naphthylimide,
N-(pentafluorobenzenesulfonyloxy)succinimide,
N-(pentafluorobenzenesulfonyloxy)phthalimide,
N-(pentafluorobenzenesulfonyloxy)diphenylmaleimide,
N-(pentafluorobenzenesulfonyloxy)bicyclo[2.2.1]hept-5-ene-2,3-dicarboxyimide,
N-(pentafluorobenzenesulfonyloxy)-7-oxabicyclo[2.2.1]hept-5-ene-2,3-dicarboxyimide,
N-(pentafluorobenzenesulfonyloxy)bicyclo[2.2.1]heptan-5,6-oxy-2,3-dicarboxyimide,
N-(pentafluorobenzenesulfonyloxy)naphthylimide,
N-(perfluoro-n-octanesulfonyloxy)succinimide,
N-(perfluoro-n-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-ene-2,3-dicarboxyimide,
N-(perfluoro-n-octanesulfonyloxy)-7-oxabicyclo[2.2.1]hept-5-ene-2,3-dicarboxyimide,
N-(perfluoro-n-octanesulfonyloxy)bicyclo[2.2.1]heptan-5,6-oxy-2,3-dicarboxyimide,
N-(perfluoro-n-octanesulfonyloxy)naphthylimide, and
N-{(5-methyl-5-carboxymethanebicyclo[2.2.1]hept-2-yl)sulfonyloxy}succinimide.

(5) Diazomethane Compounds:

As examples of the diazomethane compounds, compounds shown by the following formula (8) can be given:

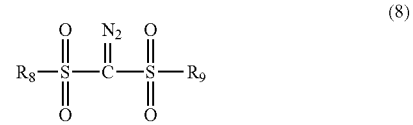

wherein $R_8$ and $R_9$ individually represent a monovalent group such as an alkyl group, aryl group, haloalkyl group, and haloaryl group.

As specific examples of the diazomethane compounds, bis(trifluoromethanesulfonyl)diazomethane, bis(cyclohexanesulfonyl)diazomethane, bis(benzenesulfonyl)diazomethane, bis(p-toluenesulfonyl)diazomethane, methanesulfonyl-p-toluenesulfonyldiazomethane, cyclohexanesulfonyl-1,1-dimethylethylsulfonyldiazomethane, bis(1,1-dimethylethanesulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane can be given.

(6) Disulfonylmethane Compounds

As examples of disulfonylmethane compounds, a compound of the following formula (9) can be given:

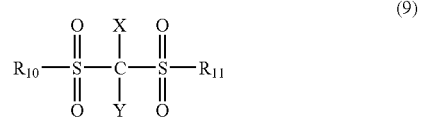

wherein $R_{10}$ and $R_{11}$ individually represent a linear or branched monovalent aliphatic hydrocarbon group, cycloalkyl group, aryl group, aralkyl group, or other monovalent organic group having a hetero atom, and X and Y individually represent an aryl group, a hydrogen atom, a linear or branched monovalent aliphatic hydrocarbon group, or other monovalent organic group having a hetero atom, provided that at least one of X and Y represents an aryl group, or X and Y are bonded to form a monocyclic or polycyclic structure having at least one unsaturated bond, or X and Y are bonded to form a group of the following formula:

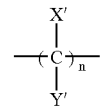

wherein X' and Y' individually represent a hydrogen atom, halogen atom, a linear or branched alkyl group, cycloalkyl group, aryl group, or aralkyl group, or X' and Y' each bonded to the same or different carbon atoms are connected each other to form a monocyclic carbon structure, and n is an integer from 2 to 10.

As an acid generator (B), (1) the onium salt compounds and (4) the sulfonimide compounds are preferable. It is particularly preferable to use at least one compound selected from the group consisting of bis(4-t-butylphenyl)iodonium trifluoromethanesulfonate, bis(4-t-butylphenyl)iodonium perfluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl) iodonium 2,4-difluorobenzenesulfonate, triphenylsulfonium trifluoromethanesulfonate, triphenylsulfonium perfluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluorobenzenesulfonate, triphenylsulfonium 2,4-difluoromethylbenzenesulfonate, N-(trifluoromethanesulfonyloxy)succinimide, N-(trifluoromethanesulfonyloxy)bicyclo[2.2.1]hept-5-ene-2,3-dicarboxyimide, N-(10-camphorsulfonyloxy)succinimide, N-(10-camphorsulfonyloxy)bicyclo[2.2.1]hept-5-ene-2,3-dicarboxyimide, and N-{(5-methyl-5-carboxymethanebicyclo[2.2.1]hept-2-yl) sulfonyloxy}succinimide.

Acid-Dissociable Group-Containing Resin

The acid-dissociable group-containing resin used in the present invention is a resin, insoluble or scarcely soluble in alkali by itself, obtainable from a resin containing one or more acid functional groups such as a phenolic hydroxyl group or carboxyl group by replacing one or more hydrogen atoms in the acid functional groups with one or more acid-dissociable groups that can dissociate in the presence of an acid. The term "insoluble or scarcely soluble in alkali" used herein refers to characteristics in which 50% or more of the initial thickness of a resin film remains after development when the resist film formed only from the acid-dissociable group-containing resin is developed instead of a resist coating under alkaline development conditions employed for forming a resist pattern using the resist coating formed from the radiation-sensitive resin composition comprising the other acid-dissociable group-containing resin.

As examples of the acid-dissociable group in the acid-dissociable group-containing resin, a substituted methyl group, 1-substituted ethyl group, 1-substituted n-propyl group, 1-branched alkyl group, silyl group, germyl group, alkoxycarbonyl group, acyl group, and cyclic acid-dissociable group can be given.

As examples of a substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, 4-bromophenacyl group, 4-methoxyphenacyl group, 4-methylthiophenacyl group, α-methylphenacyl group, cyclopropylmethyl group, benzyl group, diphenylmethyl group, triphenylmethyl group, 4-bromobenzyl group, 4-nitrobenzyl group, 4-methoxybenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, and t-butoxycarbonylmethyl group can be given.

As examples of the 1-substituted ethyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropyloxyethyl group, 1-cyclohexyloxyethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, and 1-t-butoxycarbonylethyl group can be given.

As examples of 1-substituted n-propyl group, a 1-methoxy-n-propyl group, and 1-ethoxy-n-propyl group can be given.

As examples of the 1-branched alkyl group, an i-propyl group, sec-butyl group, t-butyl group, 1,1-dimethylpropyl group, 1-methylbutyl group, and 1,1-dimethylbutyl group can be given.

As examples of the silyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, and triphenylgermyl group can be given.

As examples of the alkoxycarbonyl group, a methoxycarbonyl group, ethoxycarbonyl group, i-propoxycarbonyl group, and t-butoxycarbonyl group can be given.

As examples of the acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, sccucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group can be given.

As examples of the cyclic acid-dissociable group, a cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, and 3-tetrahydrothiophene-1,1-dioxide group can be given.

Of these acid-dissociable groups, a benzyl group, t-butoxycarbonylmethyl group, 1-methoxyethyl group, 1-ethoxyethyl group, 1-cyclohexyloxyethyl group, 1-ethoxy-n-propyl group, t-butyl group, 1,1-dimethylpropyl group, trimethylsilyl group, t-butoxycarbonyl group, tetrahydropyranyl group, tetrahydrofuranyl group, tetrahydrothiopyranyl group, tetrahydrothiofuranyl group, and the like are preferable.

The amount of the acid-dissociable groups introduced into the acid-dissociable group containing resin (the amount of the number of acid-dissociable groups in the total number of acidic functional groups and acid-dissociable groups in the acid-dissociable group-containing resin) is preferably 10-100%, and still more preferably 15-100%, although the amount varies depending on the types of acid-dissociable groups and the alkali-soluble resin into which the acid-dissociable groups are introduced.

The acid-dissociable group containing resin can be prepared by, for example, a method of introducing one or more acid-dissociable groups into an alkali-soluble resin which has previously been manufactured, a method of (co)polymerizing polymerizable unsaturated monomers having an acid-dissociable group, optionally together with one or more other polymerizable unsaturated monomers, a method of (co)polycondensing one or more polycondensation components having an acid-dissociable group, optionally together with one or more other polycondensation components, or the like.

The (co)polymerization of the polymerizable unsaturated monomers having an acid-dissociable group in the manufacture of the acid-dissociable group-containing resin can be carried out by block polymerization, solution polymerization, precipitation polymerization, emulsion polymerization, suspension polymerization, block-suspension polymerization, or the like using an appropriate polymerization initiator or catalyst such as a radical polymerization initiator, anionic polymerization catalyst, conjugated anionic polymerization catalyst, cationic polymerization catalyst, or the like according to the type of monomers or reaction media. The (co) condensation of polycondensation components having an acid-dissociable group can be carried out in an aqueous medium or a mixture of water and a hydrophilic solvent in the presence of an acidic catalyst.

The polystyrene-reduced weight molecular weight (hereinafter referred to as "Mw") of the acid-dissociable group containing resin determined by gel permeation chromatography is preferably 1,000-500,000, and still more preferably 3,000-300,000.

Mw/Mn, the ratio of Mw to Mn, which is the polystyrene-reduced number average molecular weight of the resin, determined by gel permeation chromatography (GPC) is usually 1-10, and preferably 1-5.

An alkali insoluble or scarcely soluble resin having the recurring unit of the following formula (10) and an acid-dissociable group (hereinafter referred to from time to time as "resin (C-a1)") is particularly preferable as the acid-dissociable group-containing resin for a radiation-sensitive resin composition to be fabricated using which a KrF excimer laser. The resin (C-a1) is also suitable for radiation-sensitive resin compositions to be fabricated utilizing an $F_2$ excimer laser, electron beams, and the like.

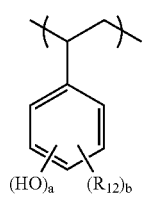

(10)

In the formula (10), $R_{12}$ represents a hydrogen atom or monovalent organic group and a and b indicates a natural number from 1 to 3.

As examples of the recurring unit represented by the formula (10), units obtainable by cleavage of a non-aromatic double bond such as p-hydroxystyrene, m-hydroxystyrene, o-hydroxystyrene, α-methylhydroxylstyrene, 3-methyl-4-hydroxystyrene, 2-methyl-4-hydroxystyrene, 2-methyl-3-hydroxystyrene, 4-methyl-3-hydroxystyrene, 5-methyl-3-hydroxystyrene, 3,4-dihydroxystyrene, and 2,4,6-trihydroxystyrene can be given. Of these, units obtainable by cleavage of a non-aromatic double bond such as p-hydroxystyrene, m-hydroxystyrene, and o-hydroxystyrene are preferable.

As the recurring units containing an acid-dissociable group, recurring units in which the phenolic hydroxyl group or carboxyl group in the above-mentioned recurring units has been protected with the above acid-dissociable group can be given.

Given as examples of the other recurring units in the resin (C-a1) are groups obtained by cleavage of the polymerizable unsaturated bond in the following compounds: vinyl aromatic compounds such as styrene, α-methylstyrene, 2-methylstyrene, 3-methylstyrene, 4-methylstyrene, 2-methoxystyrene, 3-methoxystyrene, 4-methoxystyrene, 4-t-butoxystyrene, 4-t-butoxycarbonyloxystyrene, 4-t-butoxycarbonylmethyloxystyrene, 4-(2'-t-butoxycarbonylethyloxy)styrene, 4-tetrahydrofuranyloxystyrene, and 4-tetrahydropyranyloxystyrene;

(meth)acrylates such as methyl(meth)acrylate, ethyl(meth)acrylate, n-propyl(meth)acrylate, i-propyl(meth)acrylate, n-butyl(meth)acrylate, i-butyl(meth)acrylate, sec-butyl(meth)acrylate, t-butyl(meth)acrylate, n-pentyl(meth)acrylate, neopentyl(meth)acrylate, n-hexyl(meth)acrylate, 2-ethylhexyl(meth)acrylate, 2-hydroxyethyl(meth)acrylate, 2-hydroxypropyl(meth)acrylate, 3-hydroxypropyl(meth)acrylate, cyclopentyl(meth)acrylate, cyclohexyl(meth)acrylate, norbornyl(meth)acrylate, isobornyl(meth)acrylate, tricyclodecanyl(meth)acrylate, dicyclopentenyl(meth)acrylate, adamantyl(meth)acrylate, adamantylmethyl(meth)acrylate, tetrahydrofuranyl(meth)acrylate, tetrahydropyranyl(meth)acrylate, phenyl(meth)acrylate, benzyl(meth)acrylate, and phenethyl(meth)acrylate, and monomers shown by the following formulas (11)-(13),

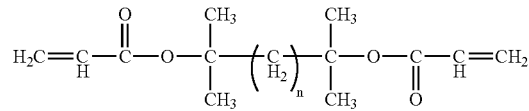

(11)

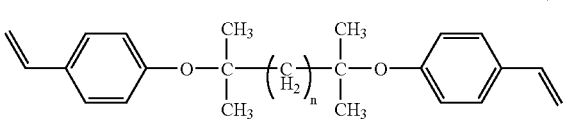

(12)

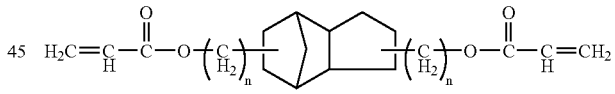

(13)

wherein n is a natural number of 1-6;

unsaturated carboxylic acids such as (meth)acrylic acid, crotonic acid, maleic acid, fumaric acid, and cinnamic acid;

carboxylalkyl esters of unsaturated carboxylic acids such as 2-carboxyethyl(meth)acrylate, 2-carboxypropyl(meth)acrylate, and 3-carboxypropyl(meth)acrylate;

unsaturated nitrile compounds such as (meth)acrylonitrile, α-chloroacrylonitrile, crotonitrile, maleinitrile, and fumaronitrile;

unsaturated amide compounds such as (meth)acrylamide, N,N-dimethyl(meth)acrylamide, crotonamide, maleinamide, and fumaramide;

unsaturated imide compounds such as maleimide, N-phenylmaleimide, and N-cyclohexylmaleimide;

and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

Of these recurring units, units obtained by cleavage of a polymerizable unsaturated bond in the compound such as styrene, α-methylstyrene, 4-t-butoxystyrene, 4-t-butoxycarbonyloxystyrene, 4-t-butoxycarbonylmethyloxystyrene, 4-(2'-t-butoxycarbonylethyloxy)styrene, t-butyl(meth)acrylate, isobornyl(meth)acrylate, tricyclodecanyl(meth)acrylate, the monomer of the above formula (11), or the monomer of the above formula (12) are preferable.

An alkali insoluble or scarcely soluble resin having at least one of the recurring units of the following formula (14) or (15) (hereinafter referred to from time to time as "resin (C-a2)") is particularly preferable as the acid-dissociable group-containing resin for a radiation-sensitive resin composition to be fabricated by utilizing a KrF excimer laser is used. The resin (C-a2) is also suitable for radiation-sensitive resin compositions to be fabricated by utilizing an $F_2$ excimer laser, electron beams, and the like.

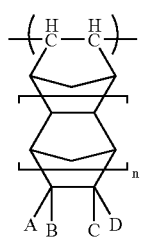

(14)

In the formula (14), A and B individually represent a hydrogen atom or an acid-dissociable group, at least one of A and B being an acid-dissociable group, D and E individually represent a hydrogen atom or a linear or branched monovalent alkyl group having 1-4 carbon atoms, and n is an integer of 0 to 2.

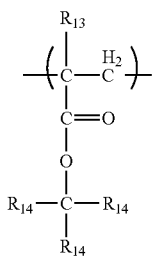

(15)

In the formula (15), $R_{13}$ represents a hydrogen atom or methyl group and $R_{14}$ individually represents a linear or branched alkyl group having 1-4 carbon atoms or a substituted or unsubstituted monovalent alicyclic hydrocarbon group having 4-20 carbon atoms, or any two of $R_{14}$ groups form, in combination with the carbon atom to which the two $R_{14}$ groups are bonded, a divalent alicyclic hydrocarbon group having 4-20 carbon atoms, with the remaining $R_{14}$ group being a linear or branched alkyl group having 1-4 carbon atoms or a substituted or unsubstituted monovalent alicyclic hydrocarbon group having 4-20 carbon atoms.

As examples of the recurring units represented by the formula (14), units obtainable by cleavage of the double bond in the norbornene ring such as
5-t-butoxycarbonylbicyclo[2.2.1]hept-2-ene,
5-(4-t-butylcyclohexyloxy)carbonylbicyclo[2.2.1]hept-2-ene,
5-(1-ethoxyethoxy)carbonylbicyclo[2.2.1]hept-2-ene,
5-(1-cyclohexyloxyethoxy)carbonylbicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
8-t-butoxycarbonyltetracyclo[4.4.0.1$^{2,5}$.1$^{7,10}$]dodec-3-ene,
8-(4-t-butylcyclohexyloxy)carbonyltetracyclo[4.4.0.1$^{2,5}$.1$^{7,10}$]dodec-3-ene,
8-(1-ethoxyethoxy)carbonyltetracyclo[4.4.0.1$^{2,5}$.1$^{7,10}$]dodec-3-ene,
8-(1-cyclohexyloxyethoxy)carbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8-tetrahydrofuanyloxycarbonyltetracyclo[4.4.0.1$^{2,5}$.1$^{7,10}$]dodec-3-ene, and
8-tetrahydropyranyloxycarbonyltetracyclo[4.4.0.1$^{2,5}$.1$^{7,10}$]dodec-3-ene can be given.

As preferable examples of the recurring units represented by the formula (15), recurring units originating from t-butoxycarbonyl(meth)acrylate and the recurring units represented by the following formula can be given.

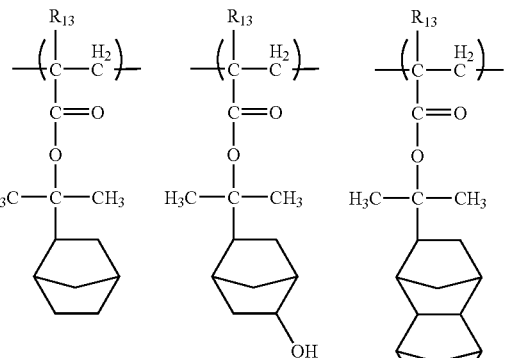

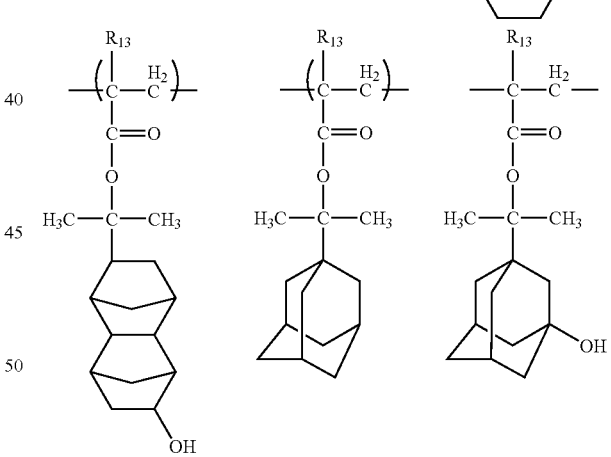

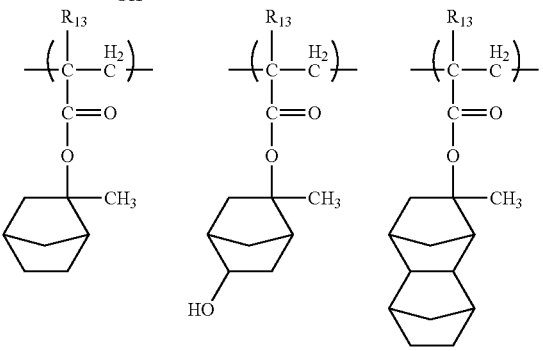

-continued

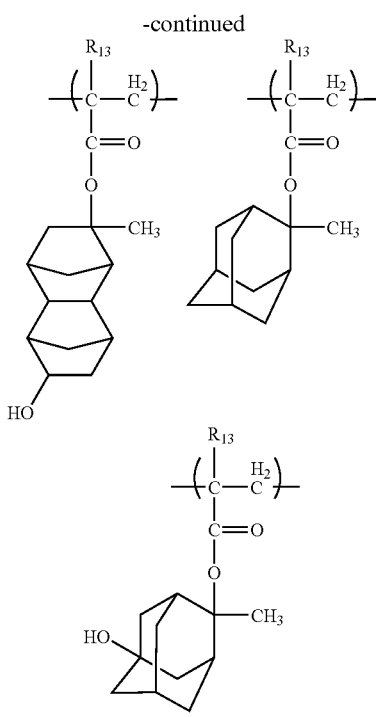

In the above formulas, $R_{13}$ represents a hydrogen atom or methyl group.

Given as examples of the other recurring units in the resin (C-a2) are units obtainable by cleavage of the polymerizable unsaturated bond in the following compounds:
monomers having a norbornene skeleton such as
norbornenebicyclo[2.2.1]hept-2-ene,
5-methylbicyclo[2.2.1]hept-2-ene,
5-ethylbicyclo[2.2.1]hept-2-ene,
5-hydroxybicyclo[2.2.1]hept-2-ene,
5-fluorobicyclo[2.2.1]hept-2-ene,
tetracyclo[4.4.0.1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-hydroxytetracyclo[4.4.0.1$^{2,5}$.1$^{7,10}$]dodec-3-ene, and
8-fluorotetracyclo[4.4.0.1$^{2,5}$.1$^{7,10}$]dodec-3-ene;
acid anhydrides such as maleic anhydride and itaconic anhydride;
the (meth)acrylates mentioned above as the other recurring units in the resin (C-a1);
and (meth)acrylates of the following formula (i),

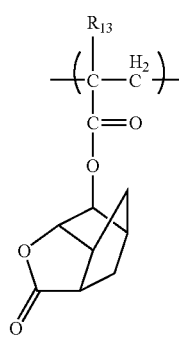

(i)

wherein $R_{13}$ represents a hydrogen atom or methyl group.

The resin (C-a2) having the recurring unit of the above formula (14) preferably further contains a recurring unit originating from maleic anhydride as the other recurring unit.

An alkali insoluble or scarcely soluble polysiloxane having at least one of the recurring units of the following formula (16) or (17) (hereinafter referred to from time to time as "resin (C-a3)") is preferable as the acid-dissociable group-containing resin particularly for a radiation-sensitive resin composition to be fabricated by utilizing a $F_2$ excimer laser. The resin (C-a3) is also suitable for radiation-sensitive resin compositions to be fabricated by utilizing an ArF excimer laser, electron beams, and the like.

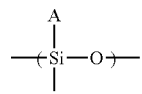

(16)

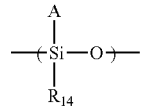

(17)

In the formula (16) and (17), A individually represents a monovalent organic group having an acid-dissociable group and $R_{14}$ represents a substituted or unsubstituted, linear, branched, or cyclic hydrocarbon group having 1-20 carbon atoms.

As the group A in the formulas (16) and (17), alicyclic hydrocarbon groups such as a cycloalkyl group, tricyclodecanyl group, tetracyclododecyl group, and adamantyl group; halides of these alicyclic hydrocarbon groups; and groups having a halogenated aromatic hydrocarbon group are preferable. In particular, the recurring units represented by the above-mentioned formula (16) are preferable, with particularly preferable recurring units being those represented by the following formulas (ii) to (v).

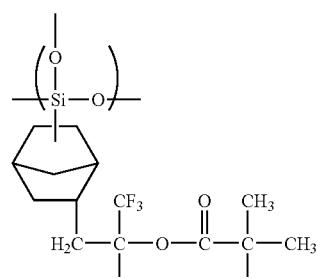

(ii)

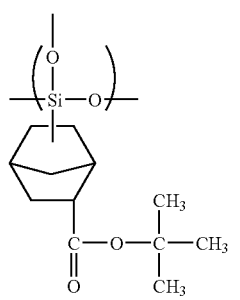

(iii)

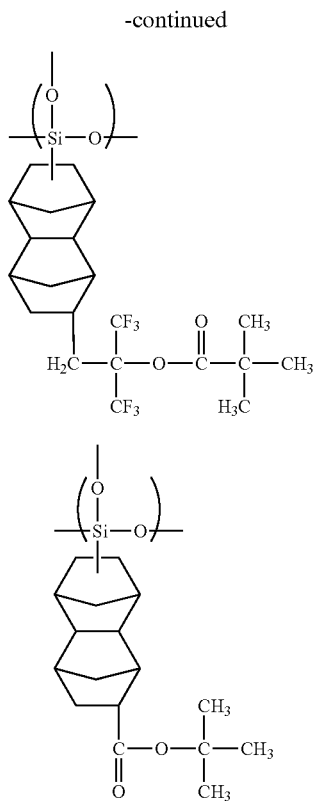

Given as preferable examples of the other recurring units in the resin (C-a3) are groups having a structure obtainable by the hydrolysis of an alkylalkoxysilane such as methyltrimethoxysilane, methyltriethoxysilane, ethyltrimethoxysilane, and ethyltriethoxysilane and recurring units represented by the following formulas (vi) to (ix).

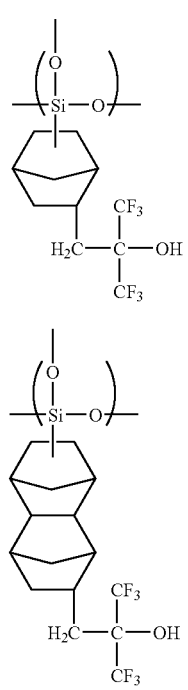

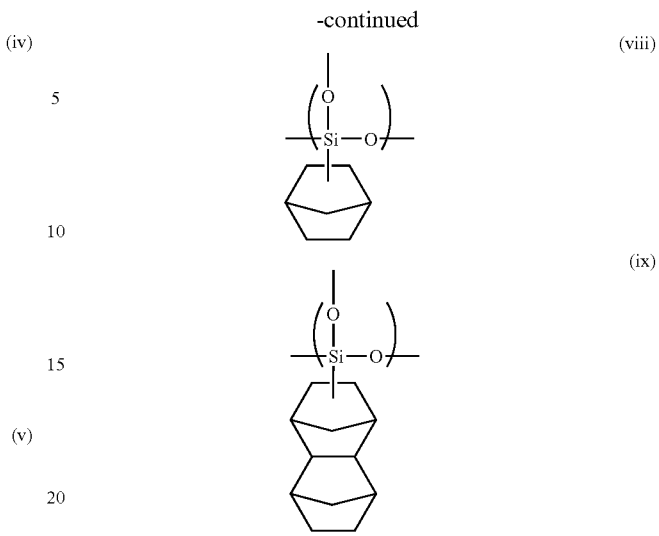

The resin (C-a3) can be obtained by cocondensing a silane compound containing an acid-dissociable group or by introducing an acid-dissociable group into a polysiloxane. It is preferable to use an acidic catalyst in carrying out the cocondensation of the silane compound containing an acid-dissociable group. It is particularly preferable to add a basic catalyst to continue the reaction after polycondensing the silane compound first in the presence of an acidic catalyst.

As examples of the acidic catalyst, inorganic acids such as hydrochloric acid, sulfuric acid, nitric acid, boric acid, phosphoric acid, titanium tetrachloride, zinc chloride, and aluminium chloride and organic acids such as formic acid, acetic acid, n-propionic acid, butyric acid, valeric acid, oxalic acid, malonic acid, succinic acid, maleic acid, fumaric acid, adipic acid, phthalic acid, terephthalic acid, acetic anhydride, maleic anhydride, citric acid, benzenesulfonic acid, p-toluenesulfonic acid, and methanesulfonic acid can be given. Of these acidic catalysts, hydrochloric acid, sulfuric acid, acetic acid, oxalic acid, malonic acid, maleic acid, fumaric acid, acetic anhydride, maleic anhydride, and the like are preferable.

As examples of the basic catalyst, inorganic bases such as lithium hydroxide, sodium hydroxide, potassium hydroxide, calcium hydroxide, barium hydroxide, sodium hydrogencarbonate, potassium hydrogencarbonate, sodium carbonate, and potassium carbonate and organic bases such as triethylamine, tri-n-propylamine, tri-n-butylamine, and pyridine can be given.

Alkali-Soluble Resin

The alkali-soluble resin used as the component (C-b)) and the component (D) is a resin having at least one functional group exhibiting affinity with an alkaline developing solution, for example, an acidic functional group such as a phenolic hydroxyl group or a carboxyl group.

As examples of such an alkali-soluble resin, an addition polymerization resin having one or more recurring units of the following formulas (18) to (20), and a polycondensation resin having one or more recurring units of the following formula (21) can be given.

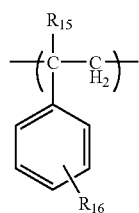

(18)

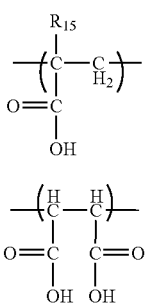

(19)

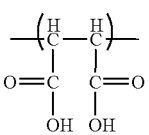

(20)

In the formulas (18)-(20), $R_{15}$ represents a hydrogen atom or a methyl group, $R_{16}$ represents a hydroxyl group, a carboxyl group, —$R_{17}$COOH, —O$R_{17}$COOH, —OCO$R_{17}$COOH, or —COO$R_{17}$COOH ($R_{17}$ is a group —(CH$_2$)$_g$—, wherein g is an integer of 1-4).

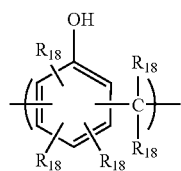

(21)

In the formula (21), $R_{18}$ individually represents a hydrogen atom or an alkyl group having 1-4 carbon atoms.

In the case where the alkali-soluble resin is an addition polymerization resin, such a resin may be formed only from the recurring units shown by the formulas (18) to (20), or may further contain one or more other recurring units inasmuch as the resin is soluble in an alkali developer.

As examples of such other recurring units, the groups previously given as the other recurring units for the resin (C-a) can be given.

The addition polymerization resin can be prepared by (co)polymerization of monomers corresponding to the recurring unit shown by the formula (18)-(20), optionally together with monomers which form the above other recurring units.

Such (co)polymerization is carried out by block polymerization, solution polymerization, precipitation polymerization, emulsion polymerization, suspension polymerization, block-suspension polymerization, or the like using an appropriate polymerization initiator or catalyst such as a radical polymerization initiator, anionic polymerization catalyst, conjugated anionic polymerization catalyst, cationic polymerization catalyst, or the like according to the type of monomers or reaction media.

In the case where the alkali-soluble resin is a polycondensation resin, such a resin may be formed only from the recurring unit shown by the formula (21), or may further contain one or more other recurring units inasmuch as the resin is soluble in an alkali developer. The polycondensation resin can be prepared by (co)polymerization of phenols and aldehydes corresponding to the recurring unit shown by the formula (21), optionally together with monomers which form the other recurring units, in an aqueous medium or a mixture of water and a hydrophilic solvent in the presence of an acidic catalyst.

As the phenols, o-cresol, m-cresol, p-cresol, 2,3-xylenol, 2,4-xylenol, 2,5-xylenol, 3,4-xylenol, 3,5-xylenol, 2,3,5-trimethyl phenol, 3,4,5-trimethyl phenol, and the like can be given. As the aldehydes, formaldehyde, trioxane, paraformaldehyde, benzaldehyde, acetaldehyde, propyl aldehyde, phenyl acetaldehyde, and the like can be given.

Although the amount of the recurring units of the above formulas (18) to (21) in the alkali-soluble resin cannot be generally specified and varies according to the types of the other optional recurring units, such an amount is preferably 10-100 mol %, and more preferably 20-100 mol %.

The alkali-soluble resin may be used as a hydrogenate when the resin has a recurring unit which contains a carbon-carbon unsaturated bond shown by the formulas (18) and (21), for example. In this instance, the hydrogenation degree is usually 70% or less, preferably 50% or less, and still more preferably 40% or less of the total amount of the carbon-carbon unsaturated bonds in the recurring units shown by the formulas (18), (21), and other similar recurring units. If the hydrogenation degree is more than 70%, developability of the alkali-soluble resin by an alkaline developer may decrease.

As an alkali-soluble resin used in the present invention, a resin containing poly(p-hydroxystyrene), p-hydroxystyrene/p-hydroxy-α-methylstyrene copolymer, p-hydroxystyrene/styrene copolymer, or the like as a major component is particularly preferable.

Although Mw of the alkali-soluble resin varies according to the characteristics desired for the radiation-sensitive resin composition, a preferable range is 1,000-150,000, with the range of 3,000-100,000 being more preferable.

These alkali-soluble resins may be used either individually or in combination of two or more.

Alkali Solubility Controller

As the alkali solubility controller used in the present invention, compounds in which a hydrogen atom in an acidic functional group such as a phenolic hydroxyl group or a carboxyl group is replaced by an acid-dissociable group can be given.

As examples of such an acid-dissociable group, the same acid-dissociable groups as mentioned in connection with the above acid-dissociable group-containing resin, such as a substituted methyl group, 1-substituted ethyl group, 1-substituted n-propyl group, 1-branched alkyl group, silyl group, germyl group, alkoxycarbonyl group, acyl group, and cyclic acid-dissociable group can be given.

The alkali solubility controller may be either a low molecular weight compound or a high molecular weight compound. The compounds shown by the following formulas (22) to (26) can be given as specific examples of the low molecular weight compound.

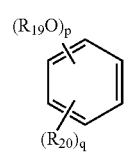

(22)

-continued

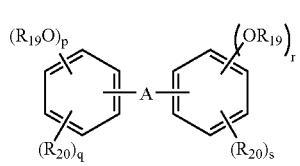

(23)

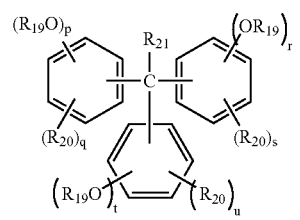

(24)

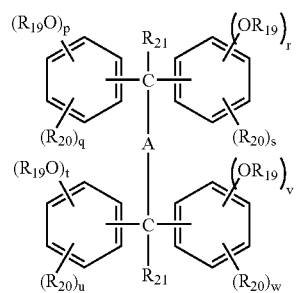

(25)

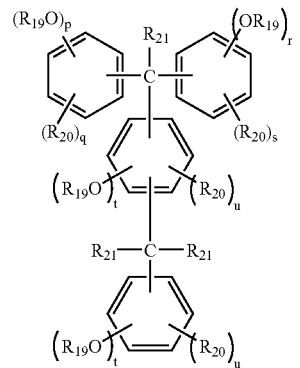

(26)

In the formulas (22)-(26), $R_{19}$ individually represents an acid-dissociable substituent, $R_{20}$ individually represents an alkyl group having 1-4 carbon atoms, phenyl group, or 1-naphthyl group, $R_{21}$ is a hydrogen atom, an alkyl group having 1-4 carbon atoms, or a phenyl group, A is a single bond, —O—, —S—, —CO—, —COO—, —SO—, —SO$_2$—, —C($R_{22}$)($R_{23}$)— (wherein $R_{22}$ and $R_{23}$ individually represent a hydrogen atom, alkyl group having 1-6 carbon atoms, acyl group having 2-11 carbon atoms, phenyl group, or 1-naphthyl group), or a phenylene group which may be either substituted or unsubstituted, p, q, r, s, t, u, v, and w are integers of 0 or more, provided that p is an integer of 1 or more in the formula (22).

As a high molecular weight alkali solubility controller, the above-described acid-dissociable group-containing resins, for example, can be used.

Crosslinking Agent (E)

As an example of the crosslinking agent used in the negative tone radiation-sensitive resin composition, a compound having one or more functional groups (hereinafter referred to as "crosslinkable functional groups") exhibiting crosslinking reactivity with the alkali-soluble resin can be given.

As specific examples of such a crosslinkable functional group, a glycidyl ether group, glycidyl ester group, glycidyl amino group, methoxymethyl group, ethoxymethyl group, benzyloxymethyl group, acetoxymethyl group, benzoiloxy methyl group, formyl group, acetyl group, vinyl group, iso-propenyl group, dimethylaminomethyl group, diethylaminomethyl group, dimethylolaminomethyl group, diethylolaminomethyl group, and morpholinomethyl group can be given.

As examples of the compound having such a crosslinkable functional group, a bisphenol A epoxy compound, bisphenol F epoxy compound, bisphenol S epoxy compound, novolac resin epoxy compound, resol resin epoxy compound, poly(hydroxystyrene) epoxy compound, methylol group-containing melamine compound, methylol group-containing benzoguanamine compound, methylol group-containing urea compound, methylol group-containing phenol compound, alkoxyalkyl group-containing melamine compound, alkoxyalkyl group-containing benzoguanamine compound, alkoxyalkyl group-containing urea compound, alkoxyalkyl group-containing phenol compound, carboxymethyl group-containing melamine resin, carboxymethyl group-containing benzoguanamine resin, carboxymethyl group-containing urea resin, carboxymethyl group-containing phenol resin, carboxymethyl group-containing melamine compound, carboxymethyl group-containing benzoguanamine compound, carboxymethyl group-containing urea compound, and carboxymethyl group-containing phenol compound can be given.

Of these compounds having a crosslinkable functional groups, a methylol group-containing phenol compound, methoxymethyl group-containing melamine compound, methoxymethyl group-containing phenol compound, methoxymethyl group-containing glycoluril compound, methoxymethyl group-containing urea compound, and acetoxymethyl group-containing phenol compound are preferable, with particularly preferable compounds being a methoxymethyl group-containing melamine compound (for example, hexamethoxymethylmelamine), methoxymethyl group-containing glycoluril compound, methoxymethyl group-containing urea compound, and the like. Methoxymethyl group-containing melamine compounds are commercially available under the trademarks CYMEL300, CYMEL301, CYMEL303, CYMEL305 (manufactured by Mitsui Cyanamid Co., Ltd.), and the like; methoxymethyl group-containing glycoluril compounds are commercially available under the trademark CYMEL 1174 (manufactured by Mitsui Cyanamid Co., Ltd.) and the like; and methoxymethyl group-containing urea compounds are commercially available under the trademark MX290 (manufactured by Sanwa Chemical Co., Ltd.) and the like.

A compound provided with crosslinking agent characteristics by replacing a hydrogen atom of an acid functional group in the alkali-soluble resin with the above-mentioned crosslinkable functional group can also be suitably used as a crosslinking agent. The amount of the crosslinkable functional group introduced is usually 5-60 mol %, preferably 10-50 mol %, and still more preferably 15-40 mol % of the total acid functional groups in the alkali-soluble resin, although the specific percentage may vary depending on the types of the crosslinkable functional group and the alkali-soluble resin into which the group is introduced. The amount of crosslinkable functional group less than 5 mol % may decrease the rate of residual coatings and tends to induce meandering and swelling of the patterns. If the amount exceeds 60 mol %, developability of exposed areas tends to decrease.

Methoxymethyl group-containing compounds such as dimethoxymethyl urea and tetramethoxymethyl glycoluril are particularly preferable as the crosslinking agent in the present invention. These crosslinking agents may be used either individually or in combination of two or more.

Although the proportion of the components in the positive tone radiation-sensitive resin composition and the negative tone radiation-sensitive resin composition varies according to the characteristics desired for the resist, a preferable proportion is as follows.

In the positive tone radiation-sensitive resin composition, the amount of the compound (A) is preferably 0.001-15 parts by weight, more preferably 0.001-10 parts by weight, and particularly preferably 0.005-5 parts by weight for 100 parts by weight of the acid-dissociable group-containing resin or alkali-soluble resin. If the amount of the compound (A) is less than 0.001 part by weight, the effect of the present invention may be obtained only insufficiently. If the amount exceeds 15 parts by weight, sensitivity and developability of exposed areas tend to decrease.

The amount of the acid generator (B) to be added is preferably 0.01-70 parts by weight, still more preferably 0.1-50 parts by weight, and particularly preferably 0.5-20 parts by weight for 100 parts by weight of the acid-dissociable group-containing resin or alkali-soluble resin. The amount of the acid generator (B) less than 0.01 part by weight may impair sensitivity and resolution. If the amount exceeds 70 parts by weight, resist coating properties and pattern configuration tend to be affected.

The amount of the alkali solubility controller to be added is preferably 5-150 parts by weight, still more preferably 5-100 parts by weight, and particularly preferably 5-50 parts by weight for 100 parts by weight of the alkali-soluble resin. The amount of alkali solubility controller less than 5 parts by weight may decrease the rate of residual coatings and induce swelling of patterns. If the amount exceeds 150 parts by weight, the coating surface tends to be roughened and the coating surface strength tends to decrease.

In the negative tone radiation-sensitive resin composition, the amount of the compound (A) is preferably 0.001-15 parts by weight, more preferably 0.001-10 parts by weight, and particularly preferably 0.005-5 parts by weight for 100 parts by weight of the alkali-soluble resin. If the amount of the compound (A) is less than 0.001 part by weight, the effect of the present invention may be obtained only insufficiently. If the amount exceeds 15 parts by weight, sensitivity and developability of exposed areas tend to decrease.

The amount of the acid generator (B) to be added is preferably 0.01-70 parts by weight, still more preferably 0.1-50 parts by weight, and particularly preferably 0.5-20 parts by weight for 100 parts by weight of the alkali-soluble resin. The amount of the acid generator (B) less than 0.01 part by weight may impair sensitivity and resolution. If the amount exceeds 70 parts by weight, resist coating properties and pattern configuration tend to be affected.

The amount of the crosslinking agent to be added is preferably 5-95 parts by weight, still more preferably 15-85 parts by weight, and particularly preferably 20-75 parts by weight for 100 parts by weight of the alkali-soluble resin. The amount of the crosslinking agent less than 5 parts by weight may decrease the rate of residual coatings and tends to induce meandering and swelling of the patterns. If the amount exceeds 95 parts by weight, developability of exposed areas tends to decrease.

Additives

Various additives such as acid diffusion controllers other than the compound (A) (hereinafter called "other acid diffusion controllers"), surfactants, and photosensitizers may be optionally added to the radiation-sensitive resin composition of the present invention. In addition, the above-described alkali-soluble resins and/or alkali solubility controllers may be added to the positive tone radiation-sensitive resin composition in which an acid-dissociable group-containing resin is used.

[Other Acid Diffusion Controllers]

It is preferable to add an acid diffusion controller to the radiation-sensitive resin composition of the present invention. The acid diffusion controller controls diffusion of an acid generated from the acid generator (B) or other acid generators upon exposure in the resist film to hinder undesired chemical reactions in the unexposed area.

The addition of the acid diffusion controller improves resolution as a resist and prevents the line width of the resist pattern from changing due to variation of post-exposure delay (PED) from exposure to development, whereby a composition with remarkably superior process stability can be obtained.

As the acid diffusion controller, nitrogen-containing organic compounds of which the basicity does not change due to exposure or heat treatment during formation of a resist pattern are preferable.

The following compounds can be given as examples of the nitrogen-containing organic compounds: a compounds represented by the following formula (27) (hereinafter referred to as "nitrogen-containing compound (I)"):

(27)

wherein $R^{21}$, $R^{22}$, and $R^{23}$ individually represent a hydrogen atom, a substituted or unsubstituted alkyl group, substituted or unsubstituted aryl group, or substituted or unsubstituted aralkyl group; diamino compounds having two nitrogen atoms in a molecule (hereinafter referred to as "nitrogen-containing compound (II)"); diamino polymers having three or more nitrogen atoms in a molecule (hereinafter referred to as "nitrogen-containing compounds (III)"); amide group-containing compounds, urea compounds, and nitrogen-containing heterocyclic compounds.

Examples of the nitrogen-containing compounds (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and alkanolamines such as ethanolamine, diethanolamine, and triethanolamine.

Examples of the nitrogen-containing compounds (II) include ethylenediamine, N,N,N',N'-tetramethylethylenediamine, tetramethylenediamine, hexamethylenediamine, N,N,N',N'-tetrakis(2-hydroxyethyl)ethylenediamine, N,N,N',N'-tetrakis(2-hydroxypropyl)ethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

As examples of the nitrogen-containing compounds (III), polyethyleneimine, polyallylamine, and a polymer of dimethylaminoethylacrylamide can be given.

Examples of the amide group-containing compounds include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compounds include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compounds include imidazoles such as imidazole, benzimidazole, 2-phenylbenzimidazole, 2-methylimidazole, 4-methylimidazole, 2-phenylimidazole, 4-phenylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, 1-piperidine ethanol, 2-piperidine ethanol, morpholine, 4-methylmorpholine, piperazine, 1,4-dimethylpiperazine, and 1,4-diazabicyclo[2.2.2]octane.

Of these nitrogen-containing organic compounds, the nitrogen-containing compounds (I), the nitrogen-containing heterocyclic compounds, and the like are preferable. Trialkylamines are particularly preferable among the nitrogen-containing compounds (I), and imidazoles are particularly preferable among the nitrogen-containing heterocyclic compounds.

The acid diffusion controllers may be used either individually or in combination of two or more.

The amount of the acid diffusion controller to be added is preferably 15 parts by weight or less, more preferably 0.001-10 parts by weight, and particularly preferably 0.005-5 parts by weight for 100 parts by weight of the acid-dissociable group-containing resin or alkali-soluble resin. If the amount of the acid diffusion controller exceeds 15 parts by weight, sensitivity as a resist and developability of the exposed area tend to decrease. If the proportion is less than 0.001 part by weight, accuracy of pattern profiles and dimensions as a resist may decrease depending on processing conditions.

[Surfactant]

The surfactants improve applicability, striation, and developability of the radiation-sensitive resin composition. As the surfactants, any of anionic surfactants, cationic surfactants, nonionic surfactants, and ampholytic surfactants may be used. Of these, nonionic surfactants are preferable.

As examples of the nonionic surfactants, polyoxyethylene higher alkyl ethers, polyoxyethylene higher alkyl phenyl ethers, higher fatty acid diesters of polyethylene glycol, commercially available products such as KP (manufactured by Shin-Etsu Chemical Co., Ltd.), Polyflow (manufactured by Kyoeisha Chemical Co., Ltd.), EFTOP (manufactured by TOHKEM PRODUCTS CORPORATION), MEGAFAC (manufactured by Dainippon Ink and Chemicals, Inc.), Fluorad (manufactured by Sumitomo 3M, Ltd.), Asahi Guard, Surflon (manufactured by Asahi Glass Co., Ltd.), and the like can be given.

These surfactants may be used either individually or in combinations of two or more.

The proportion of the surfactants to be added is 2 parts by weight or less, as an effective component, for 100 parts by weight of the total resin components in the radiation-sensitive resin composition.

[Photosensitizer]

The photosensitizers absorb energy of radiation and transmit the energy to the acid generator (A) or other acid generators, thereby increasing the amount of an acid to be generated upon exposure. The sensitizers improve apparent sensitivity of the radiation-sensitive resin composition.

As examples of preferable sensitizers, acetophenones, benzophenones, naphthalenes, biacetyl, Eosine, Rose Bengale, pyrenes, anthracenes, and phenothiazines can be given.

These photosensitizers may be used either individually or in combinations of two or more. The proportion of the sensitizers to be added is 50 parts by weight or less, and preferably 30 parts by weight or less for 100 parts by weight of the total resin component in the radiation-sensitive resin composition.

Addition of a dye or a pigment visualizes a latent image in the exposed area, thereby decreasing the effects of halation during exposure. Use of an adhesion improver improves adhesion to the substrates.

As other additives, halation inhibitors, preservation stabilizers, antifoaming agents, form improvers, and the like can be added. Specific additives include 4-hydroxy-4'-methylchalcone and the like.

[Solvent]

The positive tone radiation-sensitive resin composition and negative tone radiation-sensitive resin composition are prepared as a composition solution by dissolving the composition in a solvent so that the solid content is 5-50 wt %, for example, and filtering the composition using a filter with a pore diameter of about 0.2 µm.

Ethers, esters, ether esters, ketones, ketone esters, amides, amide esters, lactams, lactones, and (halogenated) hydrocarbons are given as examples of the solvent which can be used here. Specific examples are ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acetates, hydroxy acetates, lactates, alkoxy acetates, (non)cyclic ketones, acetoacetates, pyruvates, propionates, N,N-dialkyl formamides, N,N-dialkyl acetamides, N-alkylpyrolidones, γ-lactones, (halogenated) aliphatic hydrocarbons, and (halogenated) aromatic hydrocarbons.

More specifically, such solvents include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, isopropenyl acetate, isopropenyl propionate, toluene, xylene, methyl ethyl ketone, cyclohexanone, 2-heptanone, 3-heptanone, 4-heptanone, ethyl 2-hydroxypropionate, ethyl 2-hydroxy-2-methyl propionate, ethyl ethoxyacetate, ethyl hydroxyacetate, methyl 2-hydroxy-3-methylbutyrate, methyl lactate, ethyl lactate, n-propyl lactate, i-propyl lactate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl 3-methoxy propionate, ethyl 3-methoxypropionate, methyl 3-ethoxypropionate, ethyl 3-ethoxypropionate, N-methyl pyrolidone, N,N-dimethyl formamide, and N,N-dimethyl acetamide.

Of these solvents, propylene glycol monoalkyl ether acetates, 2-heptanone, lactates, 2-hydroxypropionates, 3-alkoxypropionates, and the like are desirable.

These solvents may be used either individually or in combination of two or more.

One or more solvents with a high boiling point may optionally be added to the solvent. Examples of such solvents with a high boiling point include benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and ethylene glycol monophenyl ether acetate.

Formation of Resist Pattern

When the resist pattern is formed from the radiation-sensitive resin composition of the present invention, the composition solution prepared as described above is applied to, for example, substrates such as a silicon wafer and a wafer coated with aluminum by rotational coating, cast coating, roll coating, and the like to form a resist film. After the resist film is treated with heat (hereinafter called "PB"), the film is exposed through a specific mask pattern. As radiation that can be used here, far ultraviolet rays such as a bright line spectrum of a mercury lamp (wavelength: 254 nm), KrF excimer laser (wavelength: 248 nm), ArF excimer laser (wavelength: 193 nm), and $F_2$ excimer laser (wavelength: 157 nm) are preferable. In addition, X-rays such as synchrotron radiation, charged particle rays such as electron beams, and the like can be used according to the types of acid generator (B). The exposure conditions such as the dose of radiation are appropriately determined according to the composition of the radiation-sensitive resin composition, types of additives, and the like.

After exposure, a heat treatment (post exposure bake, hereinafter referred to as "PEB") is preferably performed in order to improve the apparent sensitivity of the resist. PEB is performed at a temperature of 30-200° C., and preferably 50-150° C., although the temperature varies depending on the composition of the radiation-sensitive resin composition, types of additives, and the like.

The resist coating is then developed using an alkaline developer to form a specific resist pattern.

As the alkaline developer, an alkaline aqueous solution in which one or more alkaline compounds such as alkaline metal hydroxides, aqueous ammonia, alkylamines, alkanolamines, heterocyclic amines, tetraalkylammonium hydroxides, choline, 1,8-diazabicyclo[5.4.0]-7-undecene, and 1,5-diazabicyclo[4.3.0]-5-nonene are dissolved at a concentration of usually 1-10 wt %, and preferably 2-5 wt % is used. Of these, an aqueous solution of tetraalkylammonium hydroxides is particularly preferable. An appropriate amount of a water-soluble organic solvent such as methanol and ethanol, surfactants, and the like may be added to a developer consisting of the alkaline aqueous solution.

When using a developer consisting of the alkaline aqueous solution, the resist coating is generally washed with water after development.

EXAMPLES

The present invention is described below in more detail by examples. However, these examples should not be construed as limiting the present invention.

[Synthesis of Compound (A)]

The compounds (A-1) and (A-2) were synthesized according to the following method.

Synthesis Example 1

A 200 ml flask was charged with 2.0 g of t-butoxypotassium, 70 ml of tetrahydrofuran, 1.23 g of 2-methylimidazole. After stirring for 30 minutes, a solution of 2.5 g of 2,3-dihydroxyl-n-propyl bromide in 5 ml of t-butanol was added. After refluxing for one hour, 5 ml of 1 N HCl solution was added and the mixture was allowed to stand over night. The solvent was evaporated under reduced pressure. The residue was extracted with dichloromethane, washed with saturated aqueous solution of sodium hydrogencarbonate, and dried over anhydrous magnesium sulfate. After removing anhydrous magnesium sulfate, the solvent was evaporated under reduced pressure and the residue was purified by column chromatography (development solvent: methyl acetate/methanol=90/10) to obtain 1.9 g of 1-(2',3'-dihydroxylpropyl)-2-methylimidazole (compound (A-1)). $^1$H-NMR spectrum of the resulting compound is shown in FIG. 1.

Synthesis Example 2

Figure 2:
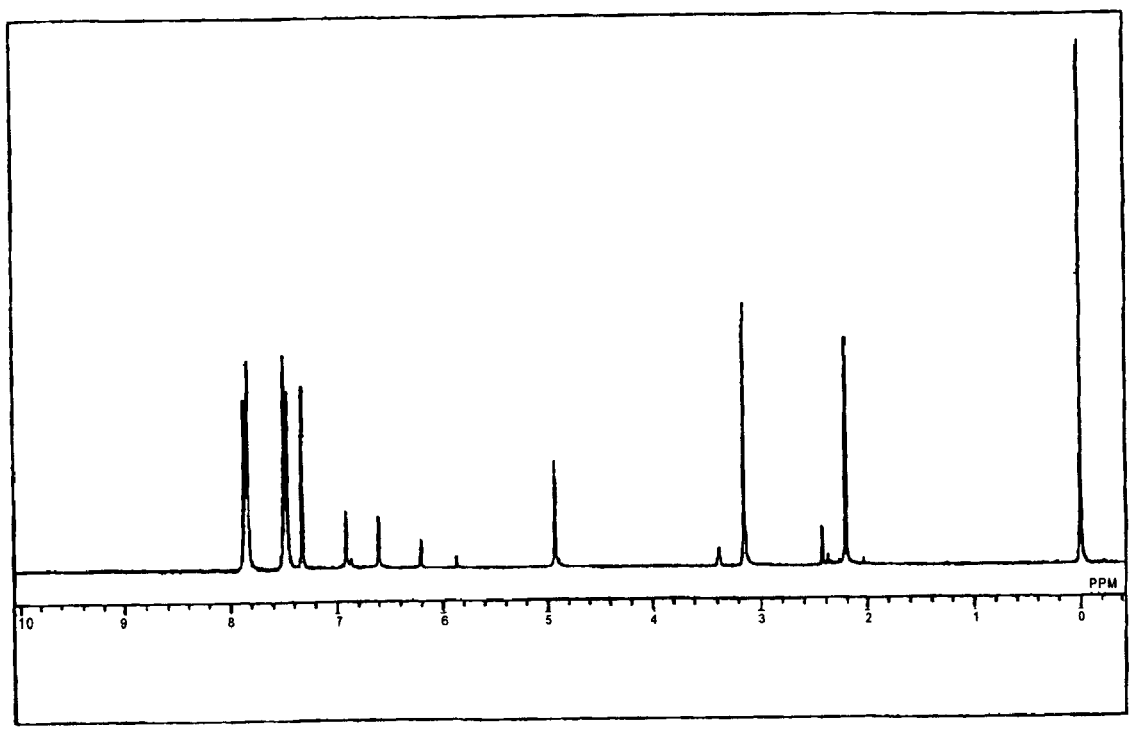
FIG. 2 is a $^1$H-NMR spectrum of the compound prepared in Synthetic Example 2.

A 200 ml flask was charged with 2.0 g of t-butoxy potassium, 70 ml of tetrahydrofuran, 1.23 g of 2-methylimidazole. After stirring for 30 minutes, a solution of 1.8 g of 1,3-dibenzylbromobenzene in 5 ml of t-butanol was added. After refluxing for one hour, the solvent was evaporated under reduced pressure and the residue was purified by column chromatography (development solvent: methyl acetate/methanol=90/10) to obtain 1.2 g of 1,3-di(2'-methyl-1'-imidazoylmethyl)benzene (compound (A-2)). $^1$H-NMR spectrum of the resulting compound is shown in FIG. 2.

[Synthesis of Acid-Dissociable Group-Containing Resin]

Acid-dissociable group-containing resins (C-1) to (C-10) were synthesized according to the following method. Mw and Mn of the acid-dissociable group-containing resins (C-1) to (C-10) were measured by gel permeation chromatography (GPC) using GPC columns (G2000H$^{XL}$×2, G3000H$^{XL}$×1, G4000H$^{XL}$×1, manufactured by Tosoh Corp.) under the following conditions. Flow rate: 1.0 ml/minute, eluate: tetrahydrofuran, column temperature: 40° C., standard reference material: monodispersed polystyrene 1. Acid-Dissociable Group-Containing Resin (C-1)

101 g of p-acetoxystyrene, 5 g of styrene, 42 g of p-t-butoxystyrene, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure. The resin was found to have Mw and Mw/Mn of 16,000 and 1.7 respectively. The result of $^{13}$C-NMR analysis confirmed that the copolymerization molar ratio of p-hydroxystyrene, styrene, and p-t-butoxystyrene of the copolymer was 72:5:23. This resin is referred to as resin (C-1).

2. Acid-Dissociable Group-Containing Resin (C-2)

100 g of p-acetoxystyrene, 25 g of t-butyl acrylate, 18 g of styrene, 6 g of AIBN, and 1 g of t-dodecylmercaptan were dissolved in 230 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure. The resin was found to have Mw and Mw/Mn of 11,500 and 1.6 respectively. The result of $^{13}$C-NMR analysis confirmed that the copolymerization molar ratio of p-hydroxystyrene, t-butyl acrylate, and styrene of the copolymer was 61:19:20. This resin is referred to as Resin (C-2).

3. Acid-Dissociable Group-Containing Resin (C-3)

97 g of p-acetoxystyrene, 51 g of p-t-butoxystyrene, 6 g of AIBN, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure. The resin was found to have Mw and Mw/Mn of 16,500 and 1.7 respectively. The result of $^{13}$C-NMR analysis confirmed that the copolymerization molar ratio of p-hydroxystyrene and p-t-butoxystyrene of the copolymer was 67:33. This resin is referred to as resin (C-3).

4. Acid-Dissociable Group-Containing Resin (C-4)

25 g of poly(p-hydroxystyrene) was dissolved in 80 g of n-butyl acetate, and nitrogen gas was bubbled through the solution for 30 minutes. After the addition of 49 g of di-t-butyl dicarbonate and 25 g of triethylamine, the mixture was reacted for 7 hours at 60° C. After the reaction, n-butyl acetate was evaporated under reduced pressure. The resulting resin was dissolved in acetone and added dropwise to a large quantity of water to coagulate the resin. The resulting white powder was filtered and dried overnight at 50° C. under reduced pressure. The resin thus obtained had an Mw of 12,000 and an Mw/Mn of 1.7. As a result of $^{13}$C-NMR analysis, the polymer was found to have a structure in which 26 mol % of hydrogen atoms of phenolic hydroxyl groups in poly(p-hydroxystyrene) were replaced by t-butoxycarbonyl groups. This resin is referred to as resin (C-4).

5. Acid-Dissociable Group-Containing Resin (C-5)

25 g of poly(p-hydroxystyrene) was dissolved in 100 g of propylene glycol monomethyl acetate, and nitrogen gas was bubbled through the solution for 30 minutes. After the addition of 4.8 g of ethyl vinyl ether and, as a catalyst, 1 g of pyridinium p-toluenesulfonate, the mixture was reacted for 12 hours at room temperature. The reaction solution was dropped into a large quantity of 1 wt % ammonium aqueous solution to precipitate the resin. The precipitate was filtered and dried overnight in a vacuum drier at 50° C. The resin thus obtained had an Mw of 13000 and an Mw/Mn of 1.7. As a result of $^1$H-NMR analysis, the polymer was found to have a structure in which 34 mol % of hydrogen atoms of phenolic hydroxyl groups in poly(p-hydroxystyrene) were replaced by ethoxyethyl groups. This resin is referred to as resin (C-5).

6. Acid-Dissociable Group-Containing Resin (C-6)

25 g of a copolymer of 92:8 p-hydroxystyrene and p-t-butoxycarbonyloxystyrene was dissolved in 100 g of propylene glycol monomethyl acetate, and nitrogen gas was bubbled through the solution for 30 minutes. After the addition of 3.3 g of ethyl vinyl ether and, as a catalyst, 1 g of pyridinium p-toluenesulfonate, the mixture was reacted for 12 hours at room temperature. The reaction solution was dropped into a large quantity of 1 wt % ammonium aqueous solution to precipitate the resin. The precipitate was filtered and dried overnight in a vacuum drier at 50° C. The resin thus obtained had an Mw of 13,000 and an Mw/Mn of 1.8. As a result of $^{13}$C-NMR analysis, the polymer was found to have a structure in which 23 mol % of hydrogen atoms of phenolic hydroxyl groups in poly(p-hydroxystyrene) were replaced by ethoxyethyl groups and 8 mol % were replaced by t-butyl groups. This resin is referred to as resin (C-6).

7. Acid-Dissociable Group-Containing Resin (C-7)

25 g of a copolymer of 90:10 p-hydroxystyrene and p-t-butoxystyrene was dissolved in 100 g of propylene glycol monomethyl acetate, and nitrogen gas was bubbled through the solution for 30 minutes. After the addition of 3.3 g of ethyl vinyl ether and, as a catalyst, 1 g of pyridinium p-toluenesulfonate, the mixture was reacted for 12 hours at room temperature. The reaction solution was dropped into a large quantity of 1 wt % ammonium aqueous solution to precipitate the resin. The precipitate was filtered and dried overnight in a vacuum drier at 50° C. The resin thus obtained had an Mw of 13,000 and an Mw/Mn of 1.01. As a result of $^{13}$C-NMR analysis, the polymer was found to have a structure in which 23 mol % of hydrogen atoms of phenolic hydroxyl groups in poly(p-hydroxystyrene) were replaced by ethoxyethyl groups and 10 mol % were replaced by t-butyl groups. This resin is referred to as resin (C-7).

8. Acid-Dissociable Group-Containing Resin (C-8)

5 g of norbornene, 11 g of maleic anhydride, 11 g of 8-hydroxytetracyclo[4.4.0.1$^{2,5}$.1$^{7,10}$]dodec-3-ene, and 23 g of 2-methyl-2-adamantyl methacrylate were dissolved homogeneously in 50 g of tetrahydrofuran. Nitrogen gas was bubbled through the solution for 30 minutes. 3 g of azobisisobutyronitrile was added to this solution as an initiator, and the mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin. This resin was a copolymer with an Mw of 6,100, containing recurring units derived from norbornene, maleic anhydride, 8-hydroxytetracyclo[4.4.0.1$^{2,5}$.1$^{7,10}$]dodec-3-ene, and 2-methyl-2-adamantyl methacrylate in the amount of 15 mol %, 35 mol %, 20 mol %, and 30 mol %, respectively. This resin is referred to as Resin (C-8).

9. Acid-Dissociable Group-Containing Resin (C-9)

30 g of a compound of the above formula (i), wherein $R_{13}$ is a methyl group, and 20 g of 2-methyl-2-adamantyl methacrylate were dissolved in 50 g of tetrahydrofuran to obtain a homogeneous solution. Nitrogen gas was bubbled through the solution for 30 minutes. 3 g of azobisisobutyronitrile was added to this solution as a polymerization initiator, and the mixture was heated at 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin. This resin was a copolymer with an Mw of 12,000, containing recurring units derived from the compound of the formula (i) and 2-methyl-2-adamantyl methacrylate in the amount of 60 mol % and 40 mol %, respectively. This resin is referred to as resin (C-9).

10. Acid-Dissociable Group-Containing Resin (C-10)

A three-necked flask equipped with a stirrer, a cooling trap, and a thermometer was charged with 1.52 g of the silane compound forming the recurring unit of the above formula (iii) (in which the alkoxy group is bonded to Si is an ethoxy group), 1.57 g of the silane compound forming the recurring unit of the above formula (iv) (in which the alkoxy group is bonded to Si is an ethoxy group), 1.91 g of 4-methyltriethoxysilane, 15 g of 4-methyl-2-pentanone, and 1.31 g of a 1.75 wt % aqueous solution of oxalic acid. The mixture was reacted for six hours at 80° C. while stirring. The flask was cooled with ice to terminate the reaction. The reaction mixture was poured into a separating funnel to remove the water layer. The organic layer was washed with ion-exchanged water until the reaction solution becomes neutral. The solvent was removed from the organic layer to obtain the resin (C-10).

Examples and Comparative Examples

Components shown in Table 1 (part(s) indicates part(s) by weight) were mixed to prepare homogeneous solutions. The solutions were filtered through a membrane filter with a pore diameter of 0.2 μm to prepare solution compositions. The solution compositions were spin-coated on a silicon wafer. PB was then performed under the conditions shown in Table 2 to form resist coatings with a thickness indicated in Table 2.

The resist coatings were exposed to radiations under the conditions shown in Table 2. A stepper "NSR2205 EX12B" (manufactured by Nikon Corp., numerical aperture: 0.55) was used in Examples using a KrF excimer laser (indicated as "KrF" in Table 2). An ArF excimer laser exposure apparatus (manufactured by Nikon Corp., numerical aperture: 0.55) was used in Examples using an ArF excimer laser (indicated as "ArF" in Table 2). An F2 excimer laser exposure apparatus "XLS" (manufactured by Ultratech Corp., numerical aperture: 0.60) in Examples using a $F_2$ excimer laser (indicated as "$F_2$" in Table 2). An electron beam lithography system "HL700" (manufactured by Hitachi, Ltd., acceleration voltage: 30 KeV) in which the acceleration voltage was remodeled to 50 KeV was used in Examples using electron beams. PEB was performed under the conditions shown in Table 2. The resist patterns were obtained by developing the resist at 23° C. for 1 minute by a paddle method using a 2.38 wt % tetramethylammonium hydroxide aqueous solution, followed by washing with purified water and drying. The results of the evaluation of each resist are shown in Table 2.

Evaluation of the resists was carried out as follows.

Sensitivity:

Sensitivity was evaluated based on an optimum exposure dose which is a dose capable of forming a 1:1 line and space pattern (1L1S) with a line width of 0.22 μm, when a resist coating formed on a silicon wafer is exposed to light, immediately followed by PEB, development in alkali, washing with water, and drying to form a resist pattern.

Resolution:

The minimum line and space (1L1S) dimension (μm) resolved by an optimum dose of irradiation was taken as the resolution.

Storage Stability:

The sensitivity of the radiation-sensitive resin compositions prepared by the above methods was calculated. The samples were then allowed to stand at room temperature for one month and the sensitivity was again calculated. If the sensitivity changed 10% or more from the original sensitivity, the sample was rated as "Bad", otherwise the sample was rated as "Good."

The compounds (A), acid generators (B), other acid diffusion controllers, other additives, and solvents in Table 1 are as follows.

Compounds (A):
A-1: 1-(2',3'-dihydroxypropyl)-2-methylimidazole
A-2: 1,3-di(2'-methyl-1'-imidazoylmethyl)benzene
A-3: 1-benzyl-2-methylimidazole
A-4: 1-benzylimidazole.

Acid Generators (B):
B-1: bis(4-t-butylphenyl)iodonium trifluoromethanesulfonate
B-2: n-trifluoromethanesulfonyloxy-5-norbornene-2,3-dicarboxyimide
B-3: bis(cyclohexanesulfonyl)diazomethane
B-4: triphenylsulfonium trifluoromethanesulfonate
B-5: 4-n-butoxy-1-naphthyltetrahydrothiophenium nonafluorobutanesulfonate Alkali-Soluble Resin:
D-1: p-hydroxystyrene/styrene copolymer (monomer ratio: 78:22, Mw=3,100, Mw/Mn=1.13, VPS3020 manufactured by Nippon Soda Co., Ltd.)

Crosslinking Agent:
E-1: N,N,N,N-tetra(methoxymethyl)glycoluril

Other Acid Diffusion Controllers:
a-1: tri-n-octylamine

Additive:
F-1: t-butyl deoxycholate

Solvents:
G-1: ethyl lactate
G-2: ethyl 3-ethoxypropionate

G-3: propylene glycol monoethyl ether acetate
G-4: 2-heptanone
G-5: cyclohexanone

TABLE 1

| | Acid diffusion controller | Acid generator | Acid-dissociable group-containing resin | Alkali soluble resin | Crosslinking agent | Additive | Solvent |
|---|---|---|---|---|---|---|---|
| | | | Unit in parentheses (part by weight) | | | | |
| Example 1 | A-2 (0.3) | B-1 (3) | C-5 (65) | | | | G-1 (250) |
| | | | C-4 (35) | | | | G-3 (550) |
| Example 2 | A-1 (0.25) | B-2 (4) | C-5 (70) | | | | G-3 (800) |
| | | | C-3 (30) | | | | |
| Example 3 | A-2 (0.3) | B-2 (3) | C-7 (100) | | | | G-1 (250) |
| | | | | | | | G-3 (550) |
| Example 4 | A-4 (0.4) | B-2 (4) | C-1 (100) | | | | G-1 (800) |
| Example 5 | A-2 (0.3) | B-1 (3) | C-2 (100) | | | | G-1 (400) |
| | | | | | | | G-3 (400) |
| Example 6 | A-3 (0.4) | B-2 (5) | C-3 (100) | | | | G-1 (400) |
| | | | | | | | G-3 (400) |
| Example 7 | A-2 (0.1) | B-2 (5) | C-6 (100) | | | | G-1 (250) |
| | A-4 (0.2) | | | | | | G-3 (550) |
| Example 8 | A-3 (0.3) | B-3 (3) | C-7 (100) | | | | G-1 (250) |
| | | | | | | | G-3 (550) |
| Example 9 | A-2 (0.2) | B-5 (4) | C-8 (100) | | | F-1 (10) | G-4 (500) |
| | | | | | | | G-5 (100) |
| Example 10 | A-2 (0.3) | B-4 (1) | C-9 (100) | | | | G-4 (600) |
| | | B-5 (2) | | | | | |
| Example 11 | A-4 (0.3) | B-4 (3) | C-1 (100) | | | | G-1 (400) |
| | | | | | | | G-3 (400) |
| Example 12 | A-3 (0.1) | B-4 (1.5) | C-10 (100) | | | | |
| Example 13 | A-2 (0.2) | B-4 (3) | | D-1 (100) | E-1 (7) | | G-1 (550) |
| | | | | | | | G-2 (250) |
| Comparative Example 1 | a-1 (0.2) | B-3 (5) | C-5 (65) | | | | G-1 (250) |
| | | | C-4 (35) | | | | G-3 (550) |
| Comparative Example 2 | a-1 (0.3) | B-1 (4) | C-2 (100) | | | | G-1 (400) |
| | | | | | | | G-3 (400) |

TABLE 2

| | Film thickness (Å) | PB Conditions | Light source | PEB Conditions | Resolution (μm) | Sensitivity | Storage stability |
|---|---|---|---|---|---|---|---|
| Example 1 | 5,000 | 100° C., 90 sec | KrF | 110° C., 90 sec | 0.15 | 32 mJ | Good |
| Example 2 | 5,000 | 100° C., 90 sec | KrF | 110° C., 90 sec | 0.15 | 33 mJ | Good |
| Example 3 | 5,000 | 100° C., 90 sec | KrF | 100° C., 90 sec | 0.15 | 35 mJ | Good |
| Example 4 | 5,000 | 120° C., 90 sec | KrF | 130° C., 90 sec | 0.14 | 35 mJ | Good |
| Example 5 | 5,000 | 120° C., 90 sec | KrF | 140° C., 90 sec | 0.16 | 37 mJ | Good |
| Example 6 | 5,000 | 120° C., 90 sec | KrF | 130° C., 90 sec | 0.15 | 41 mJ | Good |
| Example 7 | 5,000 | 100° C., 90 sec | KrF | 110° C., 90 sec | 0.15 | 32 mJ | Good |
| Example 8 | 5,000 | 100° C., 90 sec | KrF | 110° C., 90 sec | 0.15 | 36 mJ | Good |
| Example 9 | 4,000 | 130° C., 90 sec | ArF | 140° C., 90 sec | 0.15 | 70 mJ | Good |
| Example 10 | 4,000 | 130° C., 90 sec | ArF | 140° C., 90 sec | 0.15 | 75 mJ | Good |

The present invention provides a radiation-sensitive resin composition exhibiting high resolution and high storage stability as a composition, and sensible to active radiations, for example, deep ultraviolet rays represented by a KrF excimer laser, ArF excimer laser, and F$_2$ excimer laser, and electron beams.

What is claimed is:

1. A positive tone radiation-sensitive resin composition comprising:
   (A) compound shown by the following formula (1),
   (B) a photoacid generator, and
   (C-a) a resin protected by an acid-dissociable group, insoluble or scarcely soluble in alkali, but becoming soluble in alkali when the acid-dissociable group dissociates,

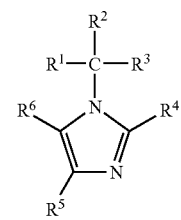

(1)

wherein $R^1$, $R^2$, $R^3$, $R^4$, $R^5$, and $R^6$ individually represent a hydrogen atom, cyano group, substituted or unsubstituted alkyl group having 1-20 carbon atoms, substituted or unsubstituted alicyclic group having 3-20 carbon atoms, substituted or unsubstituted alkenyl group having 2-20 carbon atoms, substituted or unsubstituted aryl group, or substituted or unsubstituted heteroaryl group, provided that any two groups selected from $R^1$, $R^2$, $R^3$, $R^4$, $R^5$, and $R^6$ may be bonded together to form a ring which may comprise a hetero atom or may bond together to form a dimer and further provided that at least one of the $R^1$, $R^2$, $R^3$, $R^4$, $R^5$, and $R^6$ groups is not a hydrogen atom;

wherein the resin (C-a) protected by an acid-dissociable group, insoluble or scarcely soluble in alkali, but becoming soluble in alkali when the acid-dissociable group dissociates comprises a recurring unit of the following formula (10),

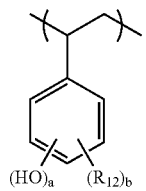

(10)

wherein $R_{12}$ represents a hydrogen atom or monovalent organic group and a and b indicates a natural number from 1 to 3.

2. The positive tone radiation-sensitive resin composition of claim 1
wherein $R^1$, $R^2$, $R^3$, $R^5$, and $R^6$ individually represent a hydrogen atom, cyano group, substituted or unsubstituted alkyl group having 1-20 carbon atoms, substituted or unsubstituted alicyclic group having 3-20 carbon atoms, substituted or un substituted alkenyl group having 2-20 carbon atoms, substituted or unsubstituted aryl group, or substituted or unsubstituted heteroaryl group, and wherein $R^4$ is a cyano group, an unsubstituted alkyl group having 6-20 carbon atoms, a substituted alkyl group having 2-20 carbon atoms, a substituted or unsubstituted alicyclic group having 6-20 carbon atoms, a substituted or unsubstituted alkenyl group having 2-20 carbon atoms, substituted or unsubstituted aryl group, or a substituted or unsubstituted heteroaryl group, provided that any two groups selected from $R^1$, $R^2$, $R^3$, $R^4$, $R^5$, and $R^6$ may be bonded together to form a ring which may comprise a hetero atom or may bond together to form a dimer.

3. The radiation-sensitive resin composition according to claim 1, wherein the resin (C-a) protected by an acid dissociable group, insoluble or scarcely soluble in alkali, but becoming soluble in alkali when the acid-dissociable group dissociates further comprises at least one recurring unit of the following formula (10-1) or (10-2),

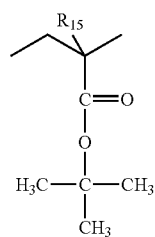

(10-1)

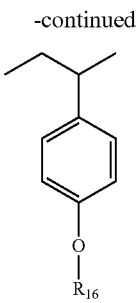

(10-2)

wherein $R_{15}$ represents a hydrogen atom or a methyl group and $R_{16}$ represents a 1-branched alkyl group, an alkoxycarbonyl group or a 1-substituted ethyl group.

4. The positive tone radiation-sensitive resin composition of claim 1, wherein
the photoacid generator comprises at least one compound selected from the group consisting of onium salt compounds, sulfone compounds, sulfonimide compounds, diazomethane compounds, disulfonylmethane compounds, and oximesulfonate compounds.

5. The radiation-sensitive resin composition according to claim 4, wherein the photoacid generator (B) is at least one compound selected from the group consisting of onium salt compounds and oximesulfonate compounds.

6. The radiation-sensitive resin compositions according to claim 4, wherein the photoacid generator (B) is at least one compound selected from the group consisting of onium salt compounds and diazomethane compounds.

7. A positive tone radiation-sensitive resin composition comprising:
(A) compound shown by the following formula (1),
(B) a photoacid generator, and
(C-a) a resin protected by an acid-dissociable group, insoluble or scarcely soluble in alkali, but becoming soluble in alkali when the acid-dissociable group dissociates,

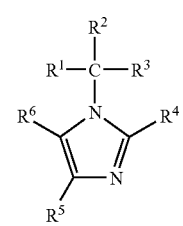

(1)

wherein $R^1$, $R^2$, $R^3$, $R^4$, $R^5$, and $R^6$ individually represent a hydrogen atom, cyano group, substituted or unsubstituted alkyl group having 1-20 carbon atoms, substituted or unsubstituted alicyclic group having 3-20 carbon atoms, substituted or unsubstituted alkenyl group having 2-20 carbon atoms, substituted or unsubstituted aryl group, or substituted or unsubstituted heteroaryl group, provided that any two groups selected from $R^1$, $R^2$, $R^3$, $R^4$, $R^5$, and $R^6$ may be bonded together to form a ring which may comprise a hetero atom or may bond together to form a dimer and further provided that at least one of the $R^1$, $R^2$, $R^3$, $R^4$, $R^5$, and $R^6$ groups is not a hydrogen atom;

wherein the resin (C-a) protected by an acid-dissociable group, insoluble or scarcely soluble in alkali, but becoming soluble in alkali when the acid-dissociable group dissociates, comprises at least one of the recurring units of the following formulas (16) or (17),

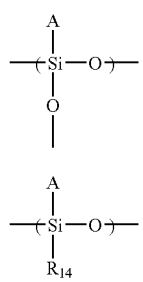

wherein A individually represents a monovalent organic group having an acid-dissociable group and $R_{14}$ represents a substituted or unsubstituted, linear, branched, or cyclic hydrocarbon group having 1-20 carbon atoms.

8. A negative tone radiation-sensitive resin composition comprising:
(A) compound shown by the following formula (1),
(B) a photoacid generator,
(D) an alkali-soluble resin, and
(E) a compound that can crosslink the alkali-soluble resin in the presence of an acid

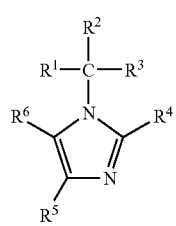

wherein $R^1$, $R^2$, $R^3$, $R^4$, $R^5$, and $R^6$ individually represent a hydrogen atom, cyano group, unsubstituted alkyl group having 1-20 carbon atoms, substituted or unsubstituted alicyclic group having 3-20 carbon atoms, substituted or unsubstituted alkenyl group having 2-20 carbon atoms, substituted or unsubstituted aryl group, or substituted or unsubstituted heteroaryl group, provided that any two groups selected from $R^1$, $R^2$, $R^3$, $R^4$, $R^5$, and $R^6$ may be bonded together to form a ring which may comprise a hetero atom or may bond together to form a dimer and further provided that at least one of the $R^1$, $R^2$, $R^3$, $R^4$, $R^5$, and $R^6$ groups is not a hydrogen atom.

9. The radiation-sensitive resin composition according to claim 8, wherein the photoacid generator (B) is at least one compound selected from the group consisting of onium salt compounds, sulfone compounds, sulfonate compounds, sulfonimide compounds, diazomethane compounds, disulfonylmethane compounds, and oximesulfonate compounds.

10. The radiation-sensitive resin composition according to claim 8, wherein the photoacid generator (B) is at least one compound selected from the group consisting of onium salt compounds and oximesulfonate compounds.

11. A positive tone radiation-sensitive resin composition comprising:
(A) a compound selected from the group consisting of: 1-cyclohexylimidazole; 1-phenylimidazole; 1-naphtylimidazole; 1-anthrylimidazole; 1-norbornylimidazole; 1-adamantylimidazole; 1-(2'-hydroxyethyl)imidazole; 1-(3'-hydroxy-n-butyl)imidazole; 1-methoxyimidazole; 1-(2'-methyl-n-propoxy)imidazole; 1-cyanoimidazole; 1-(2'-cyanomethyl)imidazole; 1-methoxycarbonylimidazole; 1-ethoxycarbonylethoxyimidazole; 1-trifluoromethylimidazole; 1,2,4-trimethylimidazole; 1,2,4,5-tetramethylimidazole; 1,2-dihexylimidazole; 1-ethyl-2-cyclohexylimidazole; 1,2,4,5-tetracyclopentylimidazole; 1,2-dinaphthylimidazole; 1,2-dinorbomylimidazole; 1,2,4-triadamantylimidazole; 1,2,4,5-tetraethoxycarbonylimidazole; 1-cyano-2-methylimidazole; 1-ethyl-2-methoxyimidazole; 1-(t-butoxycarbonylmethyl) imidazole; 1-(2',3'-dihydroxypropyl)-2-methylimidazole; and 1,3-di(2'-methyl-1'-imidazoylmethyl)benzene
(B) a photoacid generator, and
(C) the following component (C-a) or (C-b),
(C-a) a resin protected by an acid-dissociable group, insoluble or scarcely soluble in alkali, but becoming soluble in alkali when the acid-dissociable group dissociates or (C-b) an alkali-soluble resin and an alkali solubility controller.

12. The radiation-sensitive resin composition according to claim 11, wherein the compound (A) is selected from the group consisting of: 1,2,4-trimethylimidazole; 1,2,4,5-tetramethylimidazole; 1-(t-butoxycarbonylmethyl)imidazole; 1-(2',3'-dihydroxypropyl)-2-methylimidazole; and 1,3-di(2'-methyl-1'-imidazoylmethyl)benzene.

* * * * *